United States Patent
Nishioka

(10) Patent No.: US 8,593,891 B2
(45) Date of Patent: Nov. 26, 2013

(54) SEMICONDUCTOR DEVICE AND TEST METHOD THEREOF

(75) Inventor: Naohisa Nishioka, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 239 days.

(21) Appl. No.: 13/137,969

(22) Filed: Sep. 22, 2011

(65) Prior Publication Data

US 2012/0092943 A1    Apr. 19, 2012

(30) Foreign Application Priority Data

Oct. 13, 2010    (JP) ................................ 2010-230332

(51) Int. Cl.
G11C 7/00    (2006.01)

(52) U.S. Cl.
USPC ................ 365/191; 365/51; 365/63; 365/201

(58) Field of Classification Search
USPC ..................................... 365/191, 51, 63, 201
See application file for complete search history.

(56) References Cited

U.S. PATENT DOCUMENTS

| | | |
|---|---|---|
| 6,442,717 B1 | 8/2002 | Kim |
| 6,448,661 B1 | 9/2002 | Kim et al. |
| 7,745,919 B2 | 6/2010 | Shibata et al. |
| 7,952,201 B2 | 5/2011 | Shibata et al. |
| 8,473,653 B2 * | 6/2013 | Kondo et al. ................. 710/71 |
| 2002/0109236 A1 | 8/2002 | Kim et al. |
| 2006/0267212 A1 | 11/2006 | Shibata et al. |
| 2007/0126105 A1 | 6/2007 | Yamada et al. |
| 2010/0193962 A1 | 8/2010 | Shibata et al. |
| 2011/0057819 A1 * | 3/2011 | Ide et al. ...................... 341/100 |
| 2011/0084744 A1 * | 4/2011 | Nishioka et al. ............. 327/161 |
| 2011/0201154 A1 | 8/2011 | Shibata et al. |

FOREIGN PATENT DOCUMENTS

| | | |
|---|---|---|
| JP | H 11-339499 A | 12/1999 |
| JP | 2002-305283 A | 10/2002 |
| JP | 2006-313607 A | 11/2006 |
| JP | 2007-157266 A | 6/2007 |

* cited by examiner

*Primary Examiner* — Toan Le
(74) *Attorney, Agent, or Firm* — McGinn IP Law Group, PLLC

(57) ABSTRACT

A semiconductor device includes a plurality of core chips to which chip identification information different from each other is allocated and an interface chip are layered, the plurality of core chips are commonly connected to the interface chip through a first current path including at least a through silicon via, the interface chip serially supplies an enable signal to the plurality of core chips through the first current path, and the plurality of core chips are activated based on a logic level of a bit corresponding to the chip identification information among a plurality of bits configuring the enable signal. The present invention can reduce the number of through silicon vias required to supply an enable signal.

12 Claims, 20 Drawing Sheets

| I/O CONFIG | ROW ADDRESS | COLUMN ADDRESS | SEL | | | PAGE SIZE |
| --- | --- | --- | --- | --- | --- | --- |
| | | | SEL2 | SEL1 | SEL0 | |
| 4DQ | A0~15 (X0~X15) | A0~9,11,13 (Y0~Y9,Y11,Y13) | Y13 | X15 | X14 | 1KB |
| 8DQ | A0~15 (X0~X15) | A0~9,11 (Y0~Y9,Y11,) | Y11 | X15 | X14 | 1KB |
| 16DQ | A0~15 (X0~X15) | A0~9 (Y0~Y9) | X15 | X14 | X13 | 2KB |

FIG.6

SEMICONDUCTOR DEVICE AND TEST METHOD THEREOF

BACKGROUND OF THE INVENTION

1. Field of the Invention

The present invention relates to a semiconductor device and a test method thereof, and more particularly relates to a semiconductor device that includes a plurality of core chips and an interface chip for controlling the core chips and a test method thereof.

2. Description of the Related Art

A memory capacity that is required in a semiconductor memory device such as a DRAM (Dynamic Random Access Memory) are increasing every year. To satisfy this requirement by increasing a memory capacity of each memory chip prevents to secure a yield rate because it requires finer processing than so far. Therefore, in recent years, a memory device that is called a multi-chip package where plural memory chips are laminated is suggested to satisfy the required memory capacity (see Japanese Patent Application Laid-Open (JP-A) No. 2002-305283). However, since the memory chip used in the multi-chip package is a common memory chip capable of operating even though the memory chip is a single chip, a so-called front end unit that performs a function of an interface with an external device is included in each memory chip. For this reason, it is difficult to greatly increase a memory capacity for each chip.

In addition, a circuit that constitutes the front end unit is manufactured at the same time as a back end unit including a memory core, regardless of the circuit being a circuit of a logic system. Therefore there have been a further problem that it is difficult to speed up the front end unit.

As a method to resolve the above problem, a method that detaches the front end unit from each memory chips and integrate them in one interface chip and laminates these chips, thereby constituting one semiconductor memory device, is suggested (see JP-A No. 2007-157266 or JP-A No. 2006-313607). According to this method, with respect to memory chips (Hereafter, a memory chip whose front end unit was detached is called 'a core chip'), it becomes possible to increase a memory capacity for each chip because an occupied area assignable for the memory core increases. Meanwhile, with respect to an interface chip that is integrated with the front end unit, it becomes possible to form its circuit with a high-speed transistor because the interface chip can be manufactured using a process different from that of the memory core. In addition, since the plural core chips can be allocated to one interface chip, it becomes possible to provide a semiconductor memory device that has a large memory capacity and a high operation speed as a whole.

In addition, as a method of testing a semiconductor device, "parallel test" is known which compresses a plurality of items of test data read from a memory array and outputs an obtained test result signal to an outside (see JP-A No. H11-339499). By performing a parallel test, it is possible to reduce a test time.

However, in the above conventional multichip package or a semiconductor device including a plurality of core chips and an interface chip, there has been a problem that it takes a long time to perform a test. This problem is explained in detail below with the latter case as an example.

With a semiconductor device formed with a plurality of core chips and an interface chip, a data terminal of each core chip is commonly connected to the interface chip through silicon vias. The test result signal is also outputted as a type of data, and then is supplied to the interface chip through the above through silicon vias and outputted to an outside through the interface chip. Therefore, with a scheme of outputting a test result signal from a data terminal, it is not possible to output test result signals simultaneously from a plurality of core chips. In this case, the test result signals need to be outputted sequentially from each core chip, thereby increasing the time required for the test.

SUMMARY

Therefore, it has been desired to shorten the time required for a test of the above conventional multichip package or the semiconductor device including a plurality of core chips and an interface chip.

As a method of conducting at a high speed a parallel test of semiconductor devices in which a plurality of core chips and an interface chip are layered, the inventors of the present invention proposed a scheme of outputting a test result signal outputted from each core chip, to a different through silicon via per memory chip. According to this scheme, it is possible to simultaneously conduct a parallel test of a plurality of core chips and, consequently, reduce a test time.

Meanwhile, it is possible to select one or more arbitrary core chips for which a parallel test is conducted, by supplying to each core chip an enable signal using a different through silicon via per memory chip. However, in this case, the number of through silicon vias for supplying an enable signal to core chips needs to correspond to at least the number of core chips. Moreover, when a disable signal needs to be supplied to each core chip, the number of through silicon vias for supplying the enable signal and disable signal is twice the number of core chips, and, when two or more through silicon vias are used in parallel taking disconnection into account, the number of through silicon vias required further increases.

As a result of a devoted study, the inventors of the present invention made the present invention to reduce the number of through silicon vias required to supply an arbitrary enable signal to each core chip.

In one embodiment, there is provided a semiconductor device comprising: a plurality of core chips each of which comprises a memory cell array including a plurality of memory cells; and an interface chip that controls the core chips, wherein the interface chip and the core chips are stacked, the core chips are electrically connected in common to the interface chip through a first current path, the interface chip serially supplies an enable signal comprised of a plurality of bits to the core chips through the first current path, each of the bits of the enable signal being assigned to an associated one of the core chips, and each of the core chips is activated based on a logic level of an associated one of the bits of the enable signal.

In another embodiment, there is provided a semiconductor device comprising: a plurality of core chips each of which comprises a memory cell array including a plurality of memory cells, and to which chip identification information different from each other are allocated; and an interface chip which controls the core chips, wherein the interface chip and the core chips are stacked, the core chips are electrically connected in common to the interface chip through a first current path, each of the core chips is electrically connected to the interface chip through an associated one of fourth current paths, the interface chip supplies an enable signal to the core chips through the first current path, the core chips are selectively activated by comparing the enable signal and the chip identification information, and each of the core chips is activated according to the enable signal, activated one of the core chips generating a layer test result signal by compressing test data read from the memory cell array and supplies the layer test result signal to the interface chip through the associated one of the fourth current paths.

In still another embodiment, there is provided a method of testing a semiconductor device comprising: providing the semiconductor device including a plurality of core chips each of which comprises a memory cell array including a plurality of memory cells and an interface chip that controls the core chips, the interface chip and the plurality of core chips being stacked; serially supplying an enable signal comprised of a plurality of bits from the interface chip to the core chips through a first current path electrically connected in common to the core chips, each of the bits of the enable signal being assigned to an associated one of the core chips; activating one or more of core chips based on a logic level of each bit of the enable signal; generating a layer test result signal by compressing test data read from the memory cell array in activated one or more of the core chips; and supplying the layer test result signal from activated one or more of the core chips to the interface chip through an associated one of fourth current paths.

According to the present invention, by referring to chip identification information allocated to each core chip, it is possible to enable in an arbitrary core chip an enable signal supplied commonly to each core chip. By this means, it is possible to reduce the number of through silicon vias required to supply an enable signal.

BRIEF DESCRIPTION OF THE DRAWINGS

The above and other features and advantages of the present invention will be more apparent from the following description of certain preferred embodiments taken in conjunction with the accompanying drawings, in which:

FIG. 6 is a table illustrating allocation of an address according to the I/O configuration;

DETAILED DESCRIPTION OF THE EMBODIMENTS

Preferred embodiments of the present invention will be explained below in detail with reference to the accompanying drawings.

Figure 1:
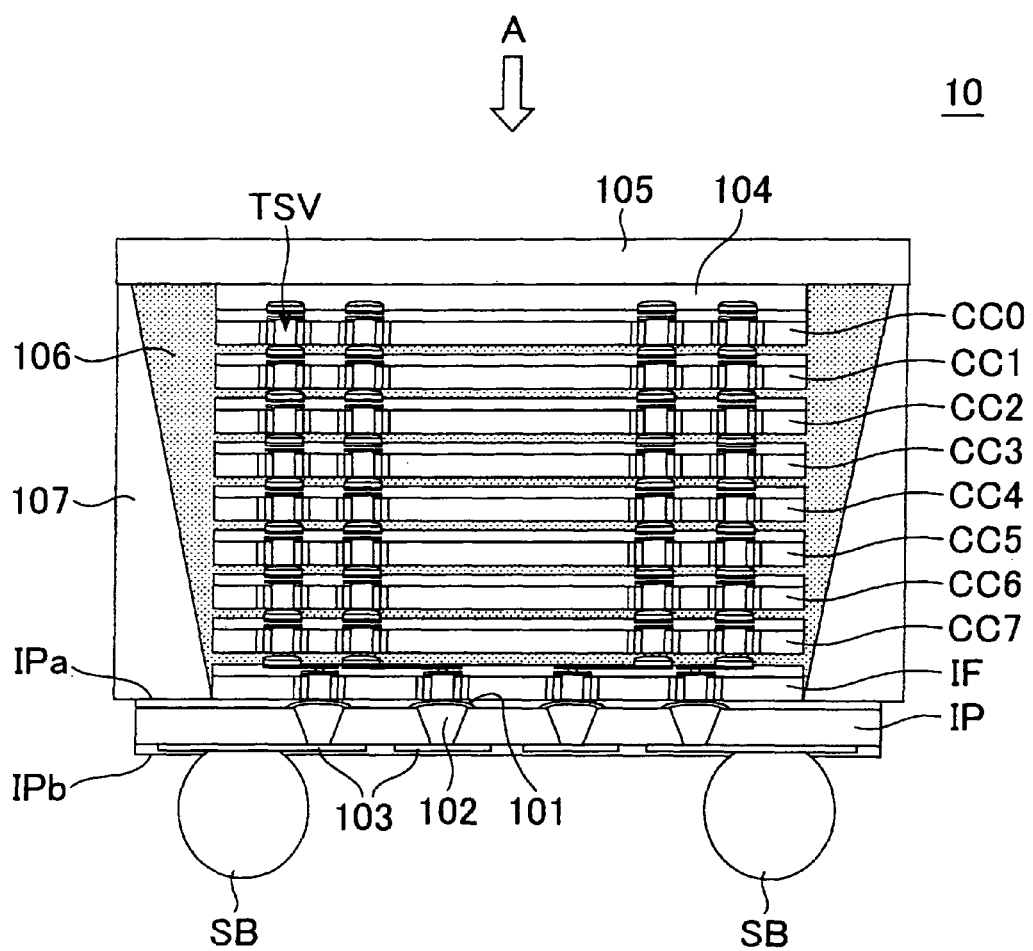
FIG. 1 is a schematic cross-sectional view provided to explain the structure of a semiconductor memory device according to the preferred embodiment of the present invention.

FIG. 1 is a schematic cross-sectional view provided to explain the structure of a semiconductor memory device 10 according to the preferred embodiment of the present invention.

As shown in FIG. 1, the semiconductor memory device 10 according to this embodiment has the structure where 8 core chips CC0 to CC7 that have the same function and structure and are manufactured using the same manufacture mask, an interface chip IF that is manufactured using a manufacture mask different from that of the core chips and an interposer IP are laminated. The core chips CC0 to CC7 and the interface chip IF are semiconductor chips using a silicon substrate and are electrically connected to adjacent chips in a vertical direction through plural through silicon vias TSV penetrating the silicon substrate. Meanwhile, the interposer IP is a circuit board that is made of a resin, and plural external terminals (solder balls) SB are formed in a back surface IPb of the interposer IP.

Each of the core chips CC0 to CC7 is a semiconductor chip which consists of circuit blocks other than a so-called front end unit (front end function) performing a function of an interface with an external device through an external terminal among circuit blocks included in a 1 Gb DDR3 (Double Data Rate 3)-type SDRAM (Synchronous Dynamic Random Access Memory). The SDRAM is a well-known and common memory chip that includes both of the front end unit and a so-called back end unit having a plural memory cells and accessing to the memory cells. The SDRAM operates even as a single chip and is capable to communicate directly with a memory controller. That is, each of the core chips CC0 to CC7 is a semiconductor chip where only the circuit blocks belonging to the back end unit are integrated in principle. As the circuit blocks that are included in the front end unit, a parallel-serial converting circuit (data latch circuit) that performs parallel/serial conversion on input/output data between a memory cell array and a data input/output terminal and a DLL (Delay Locked Loop) circuit that controls input/output timing of data are exemplified, which will be described in detail below. The interface chip IF is a semiconductor chip in which only the front end unit is integrated. Accordingly, an operation frequency of the interface chip is higher than an operation frequency of the core chip. Since the circuits that belong to the front end unit are not included in the core chips CC0 to CC7, the core chips CC0 to CC7 cannot be operated as the single chips, except for when the core chips are operated in a wafer state for a test operation in the course of manufacturing the core chips. The interface chip IF is needed to operate the core chips CC0 to CC7. Accordingly, the memory integration of the core chips is denser than the memory integration of a general single chip. The interface chip IF has a front end function for communicating with the external device at a first operation frequency, and the plural core chips CC0 to CC7 have a back end function for communicating with only the interface chip IF at a second operation frequency lower than the first operation frequency. Accordingly, each of the plural core chips CC0 to CC7 includes a memory cell array that stores plural information, and a bit number of plural read data for each I/O (DQ) that are supplied from the plural core chips CC0 to CC7 to the interface chip IF in parallel is plural and associated with a one-time read command provided from the interface chip IF to the core chips CC0 to CC7. In this case, the plural bit number corresponds to a prefetch data number to be well-known.

The interface chip IF functions as a common front end unit for the eight core chips CC0 to CC7. Accordingly, all external accesses are performed through the interface chip IF and inputs/outputs of data are also performed through the interface chip IF. In this embodiment, the interface chip IF is disposed between the interposer IP and the core chips CC0 to CC7. However, the position of the interface chip IF is not restricted in particular, and the interface chip IF may be disposed on the core chips CC0 to CC7 and may be disposed on the back surface IPb of the interposer IP. When the interface chip IF is disposed on the core chips CC0 to CC7 in a face-down manner or is disposed on the back surface IPb of the interposer IP in a face-up manner, the through silicon via TSV does not need to be provided in the interface chip IF. The interface chip IF may be disposed to be interposed between the two interposers IP.

The interposer IP functions as a rewiring substrate to increase an electrode pitch and secures mechanical strength of the semiconductor memory-device 10. That is, an electrode 101 that is formed on a top surface IPa of the interposer IP is drawn to the back surface IPb via a through-hole electrode 102 and the pitch of the external terminals SB is enlarged by the rewiring layer 103 provided on the back surface IPb. In FIG. 1, only the two external terminals SB are shown. In actuality, however, three or more external terminals are provided. The layout of the external terminals SB is the same as that of the DDR3-type SDRAM that is determined by the regulation. Accordingly, the semiconductor memory device can be treated as one DDR3-type SDRAM from the external controller.

As shown in FIG. 1, a top surface of the uppermost core chip CC0 is covered by an NCF (Non-Conductive Film) 104 and a lead frame 105. Gaps between the core chips CC0 to CC7 and the interface chip IF are filled with an underfill 106 and surrounding portions of the gaps are covered by a sealing resin 107. Thereby, the individual chips are physically protected.

Figure 2A:
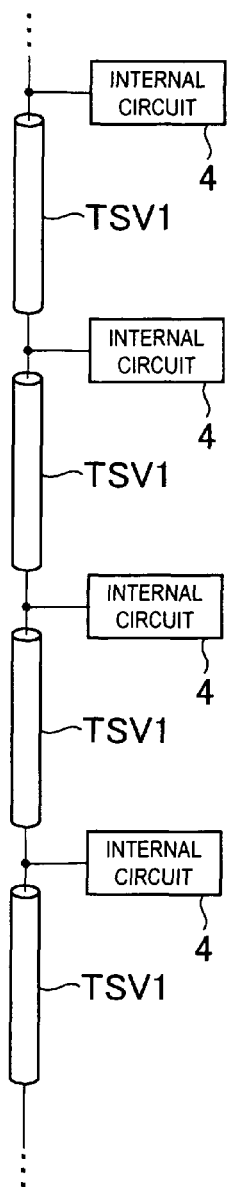
FIGS. 2A to 2C are diagram showing the various types of through silicon via provided in a core chip.

When most of the through silicon vias TSV provided in the core chips CC0 to CC7 are two-dimensionally viewed from a lamination direction, that is, viewed from an arrow A shown in FIG. 1, the through silicon vias TSV are short-circuited from the through silicon vias TSV of other layers provided at the same position. That is, as shown in FIG. 2A, the vertically disposed through silicon vias TSV1 that are provided at the same position in plan view are short-circuited, and one wiring line (a current path) is configured by the through silicon vias TSV1. This connecting configuration of the through silicon vias TSV is called 'straight connection'. The through silicon vias TSV1 that are provided in the core chips CC0 to CC7 are connected to internal circuits 4 in the core chips, respectively. Accordingly, input signals (command signal, address signal, etc.) that are supplied from the interface chip IF to the through silicon vias TSV1 shown in FIG. 2A are commonly input to the internal circuits 4 of the core chips CC0 to CC7. Output signals (data etc.) that are supplied from the core chips CC0 to CC7 to the TSV1 are wired-ORed and input to the interface chip IF.

Figure 2B:
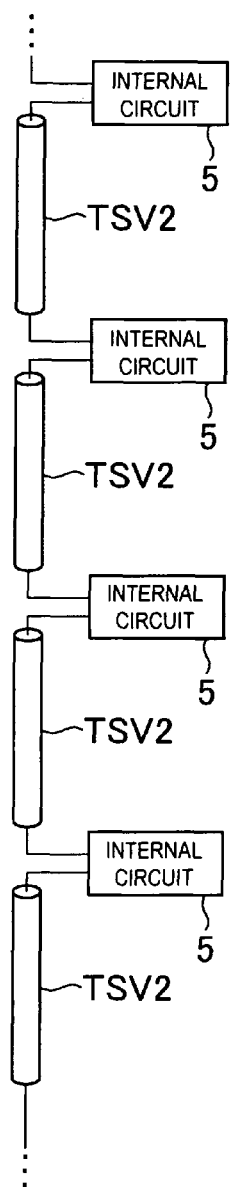

Meanwhile, as shown in FIG. 2B, the a part of through silicon vias TSV are not directly connected to the through silicon via TSV2 of other layers provided at the same position in plain view but are connected to the through silicon via TSV2 of other layers through the internal circuits 5 provided in the core chips CC0 to CC7. That is, the internal circuits 5 that are provided in the core chips CC0 to CC7 are cascade-connected through the through silicon vias TSV2. This kind of through silicon vias TSV2 is used to sequentially transmit predetermined information to the internal circuits 5 provided in the core chips CC0 to CC7. As this information, layer address information to be described below is exemplified.

Figure 2C:
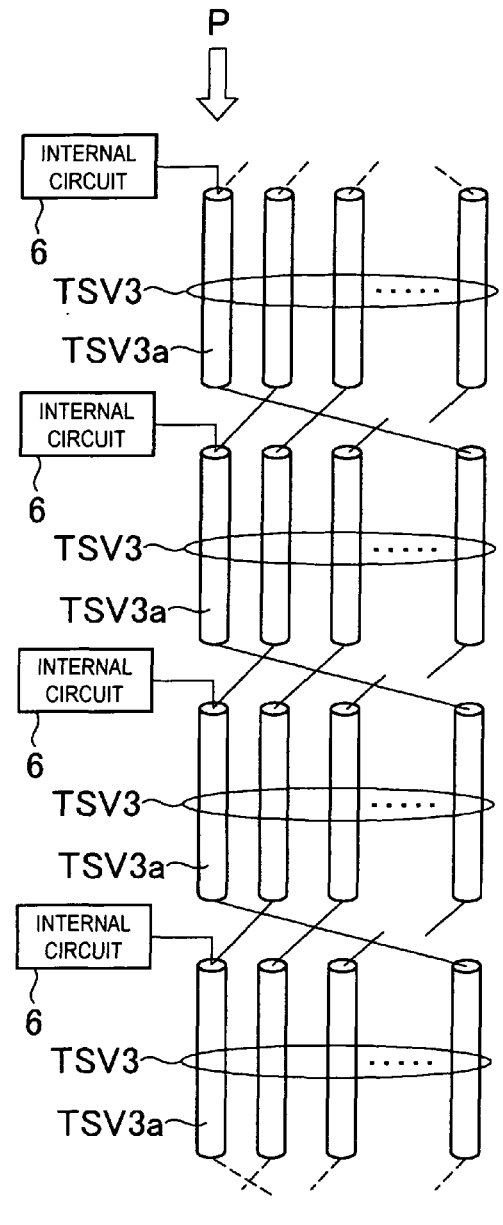

Another through silicon via TSV group is short-circuited from the through silicon via TSVs of other layer provided at the different position in plan view, as shown in FIG. 2C. With respect to this kind of through silicon via TSV group 3, internal circuits 6 of the core chips CC0 to CC7 are connected to the TSV3a provided at the predetermined position P in plan view. This connecting configuration of the through silicon vias TSV is called 'spiral connection' and described in detail later. The spiral connection results in that internal circuits 6 provided in each of the core chips is connected to the interface chip IF via different current paths from each other. Thereby, information can be selectively input to the core chips from the interface chip IF. As this information, defective chip information, test layer activation signals TLSE, and layer test result signals output from a test circuit 67 is exemplified. Details of these examples are described later.

As such, as types of the through silicon vias TSV provided in the core chips CC0 to CC7, three types (TSV1 to TSV3) shown in FIGS. 2A to 2C exist. As described above, most of the through silicon vias TSV are of a type shown in FIG. 2A, and an address signal, a command signal, and a clock signal are supplied from the interface chip IF to the core chips CC0 to CC7, through the through silicon vias TSV1 of the type shown in FIG. 2A. Read data and write data are also input to and output from the interface chip IF through the through silicon vias TSV1 of the type shown in FIG. 2A. Meanwhile, the through silicon vias TSV2 and through silicon vias TSV3 of the types shown in FIGS. 2B and 2C are used to provide individual information to the core chips CC0 to CC7 having the same structure.

Figure 3:
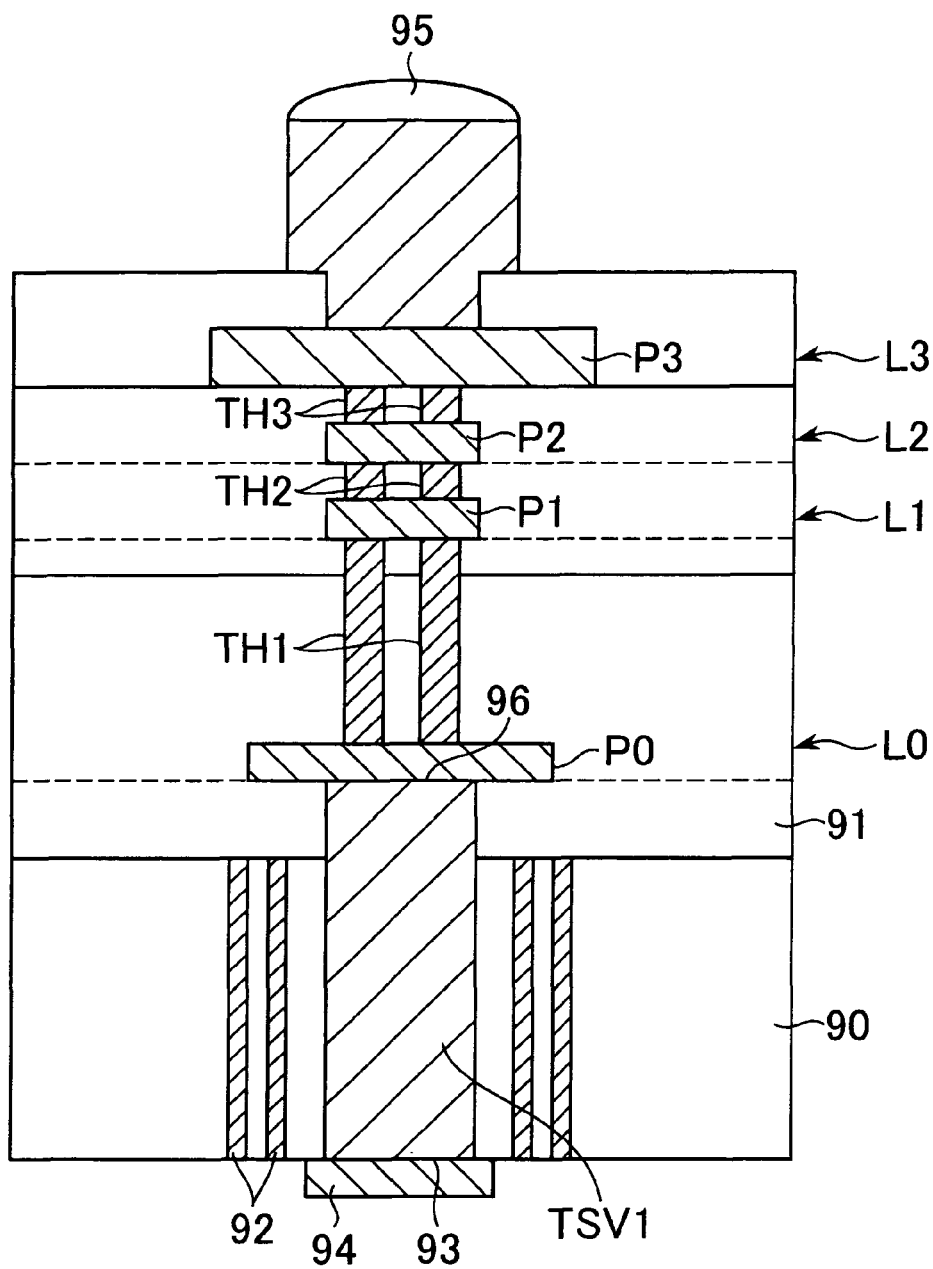
FIG. 3 is a cross-sectional view illustrating the structure of the through silicon via of the type shown in FIG. 2A.

FIG. 3 is a cross-sectional view illustrating the structure of the through silicon via TSV1 of the type shown in FIG. 2A.

As shown in FIG. 3, the through silicon via TSV1 is provided to penetrate a silicon substrate 90 and an interlayer insulating film 91 provided on a surface of the silicon substrate 90. Around the through silicon via TSV1, an insulating ring 92 is provided. Thereby, the through silicon via TSV1 and a transistor region are insulated from each other. In an example shown in FIG. 3, the insulating ring 92 is provided double. Thereby, capacitance between the through silicon via TSV1 and the silicon substrate 90 is reduced.

An end 93 of the through silicon via TSV1 at the back surface of the silicon substrate 90 is covered by a back surface bump 94. The back surface bump 94 is an electrode that contacts a surface bump 95 provided in a core chip of a lower layer. The surface bump 95 is connected to an end 96 of the through silicon via TSV1, through plural pads P0 to P3 provided in wiring layers L0 to L3 and plural through-hole electrodes TH1 to TH3 connecting the pads to each other.

Thereby, the surface bump 95 and the back surface bump 94 that are provided at the same position in plan view are short-circuited. Connection with internal circuits (not shown in the drawings) is performed through internal wiring lines (not shown in the drawings) drawn from the pads P0 to P3 provided in the wiring layers L0 to L3.

Figure 4:
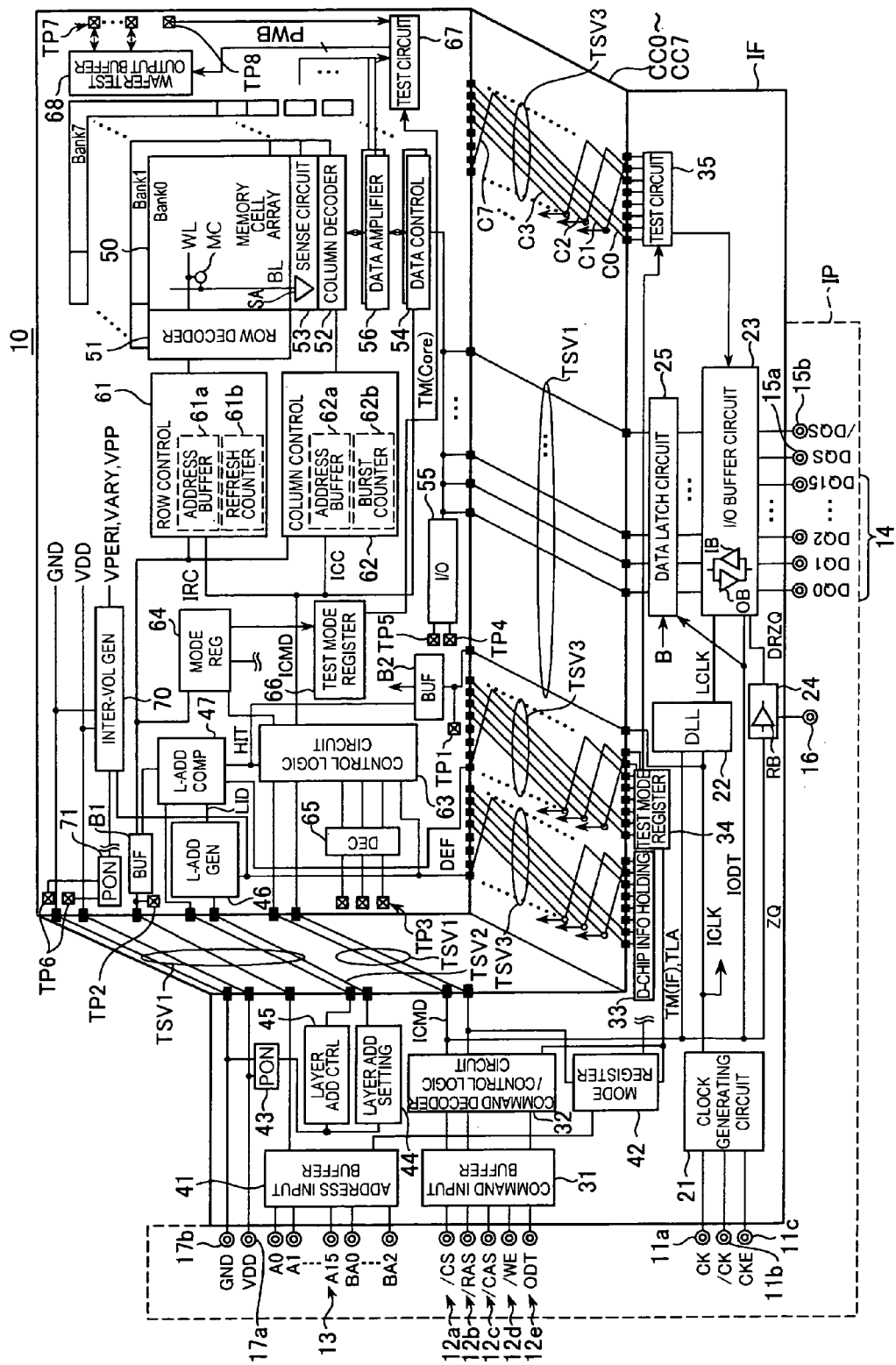
FIG. 4 is a block diagram illustrating the circuit configuration of the semiconductor memory device according the first embodiment of the present invention.

FIG. 4 is a block diagram illustrating the circuit configuration of the semiconductor memory device 10.

As shown in FIG. 4, the external terminals that are provided in the interposer IP include clock terminals 11a and 11b, an clock enable terminal 11c, command terminals 12a to 12e, an address terminal 13, a data input/output terminal 14, data strobe terminals 15a and 15b, a calibration terminal 16, and power supply terminals 17a and 17b. All of the external terminals are connected to the interface chip IF and are not directly connected to the core chips CC0 to CC7, except for the power supply terminals 17a and 17b.

First, a connection relationship between the external terminals and the interface chip IF performing the front end function and the circuit configuration of the interface chip IF will be described.

The clock terminals 11a and 11b are supplied with external clock signals CK and /CK, respectively, and the clock enable terminal 11c is supplied with a clock enable signal CKE. The external clock signals CK and /CK and the clock enable signal CKE are supplied to a clock generating circuit 21 provided in the interface chip IF. A signal where "/" is added to a head of a signal name in this specification indicates an inversion signal of a corresponding signal or a low-active signal. Accordingly, the external clock signals CK and /CK are complementary signals. The clock generating circuit 21 generates an internal clock signal ICLK, and the generated internal clock signal ICLK is supplied to various circuit blocks in the interface chip IF and is commonly supplied to the core chips CC0 to CC7 through the through silicon vias TSV.

A DLL circuit 22 is included in the interface chip IF and an input/output clock signal LCLK is generated by the DLL circuit 22. The input/output clock signal LCLK is supplied to an input/output buffer circuit 23 included in the interface chip IF. A DLL function is used to control the front end unit by using the signal LCLK synchronized with a signal of the external device, when the semiconductor memory device 10 communicates with the external device. Accordingly, DLL function is not needed for the core chips CC0 to CC7 as the back end.

The command terminals 12a to 12e are supplied with a row-address strobe signal /RAS, a column address strobe signal /CAS, a write enable signal /WE, a chip select signal /CS, and an on-die termination signal ODT. These command signals are supplied to a command input buffer 31 that is provided in the interface chip IF. The command signals supplied to the command input buffer 31 are further supplied to a command decoder/control logic circuit 32. The command decoder/control logic circuit 32 is a circuit that holds, decodes, and counts the command signals in synchronization with the internal clock ICLK and generates various internal commands ICMD. The generated internal command ICMD is supplied to the various circuit blocks in the interface chip IF and is commonly supplied to the core chips CC0 to CC7 through the through silicon vias TSV.

The address terminal 13 is a terminal to which address signals A0 to A15 and BA0 to BA2 are supplied, and the supplied address signals A0 to A15 and BA0 to BA2 are supplied to an address input buffer 41 provided in the interface chip IF. An output of the address input buffer 41 is commonly supplied to the core chips CC0 to CC7 through the through silicon vias TSV. The address signals A0 to A15 are supplied to a mode register 42 provided in the interface chip IF, when the semiconductor memory device 10 enters a mode register set. The address signals BA0 to BA2 (bank addresses) are decoded by an address decoder (not shown in the drawings) provided in the interface chip IF, and a bank selection signal B that is obtained by the decoding is supplied to a data latch circuit 25. This is because bank selection of the write data is performed in the interface chip IF.

The data input/output terminal 14 is used to input/output read data or write data DQ0 to DQ15. The data strobe terminals 15a and 15b are terminals that are used to input/output strobe signals DQS and /DQS. The data input/output terminal 14 and the data strobe terminals 15a and 15b are connected to the input/output buffer circuit 23 provided in the interface chip IF. The input/output buffer circuit 23 includes an input buffer IB and an output buffer OB, and inputs/outputs the read data or the write data DQ0 to DQ15 and the strobe signals DQS and /DQS in synchronization with the input/output clock signal LCLK supplied from the DLL circuit 22. If an internal on-die termination signal IODT is supplied from the command decoder/control logic circuit 32, the input/output buffer circuit 23 causes the output buffer OB to function as a termination resistor. An impedance code DRZQ is supplied from the calibration circuit 24 to the input/output buffer circuit 23. Thereby, impedance of the output buffer OB is designated. The input/output buffer circuit 23 includes a well-known FIFO circuit.

The calibration circuit 24 includes a replica buffer RB that has the same circuit configuration as the output buffer OB. If the calibration signal ZQ is supplied from the command decoder/control logic circuit 32, the calibration circuit 24 refers to a resistance value of an external resistor (not shown in the drawings) connected to the calibration terminal 16 and performs a calibration operation. The calibration operation is an operation for matching the impedance of the replica buffer RB with the resistance value of the external resistor, and the obtained impedance code DRZQ is supplied to the input/output buffer circuit 23. Thereby, the impedance of the output buffer OB is adjusted to a desired value.

The input/output buffer circuit 23 is connected to a data latch circuit 25. The data latch circuit 25 includes a FIFO circuit (not shown in the drawings) that realizes a FIFO function which operates by latency control realizing the well-known DDR function and a multiplexer MUX (not shown in the drawings). The input/output buffer circuit 23 converts parallel read data, which is supplied from the core chips CC0 to CC7, into serial read data, and converts serial write data, which is supplied from the input/output buffer, into parallel write data. Accordingly, the data latch circuit 25 and the input/output buffer circuit 23 are connected in serial and the data latch circuit 25 and the core chips CC0 to CC7 are connected in parallel. In this embodiment, each of the core chips CC0 to CC7 is the back end unit of the DDR3-type SDRAM and a prefetch number is 8 bits. The data latch circuit 25 and each banks of the core chips CC0 to CC7 are connected respectively, and the number of banks that are included in each of the core chips CC0 to CC7 is 8. Accordingly, connection of the data latch circuit 25 and the core chips CC0 to CC7 becomes 64 bits (8 bits×8 banks) for each DQ.

Parallel data, not converted into serial data, is basically transferred between the data latch circuit 25 and the core chips CC0 to CC7. That is, in a common SDRAM (in the SDRAM, a front end unit and a back end unit are constructed in one chip), between the outside of the chip and the SDRAM, data is input/output in serial (that is, the number of data input/output terminals is one for each DQ). However, in the core chips CC0 to CC7, an input/output of data between the interface chip IF and the core chips is performed in parallel.

This point is the important difference between the common SDRAM and the core chips CC0 to CC7. However, all of the prefetched parallel data do not need to be input/output using the different through silicon vias TSV, and partial parallel/serial conversion may be performed in the core chips CC0 to CC7 and the number of through silicon vias TSV that are needed for each DQ may be reduced. For example, all of data of 64 bits for each DQ do not need to be input/output using the different through silicon vias TSV, and 2-bit parallel/serial conversion may be performed in the core chips CC0 to CC7 and the number of through silicon vias TSV that are needed for each DQ may be reduced to ½ (32).

To the data latch circuit 25, a function for enabling a test in an interface chip unit is added. The interface chip does not have the back end unit. For this reason, the interface chip cannot be operated as a single chip in principle. However, if the interface chip never operates as the single chip, an operation test of the interface chip in a wafer state may not be performed. This means that the semiconductor memory device 10 cannot be tested in case an assembly process of the interface chip and the plural core chips is not executed, and the interface chip is tested by testing the semiconductor memory device 10. In this case, when a defect that cannot be recovered exists in the interface chip, the entire semiconductor memory device 10 is not available. In consideration of this point, in this embodiment, a portion of a pseudo back end unit for a test is provided in the data latch circuit 25, and a simple memory function is enabled at the time of a test.

The power supply terminals 17a and 17b are terminals to which power supply potentials VDD and VSS are supplied, respectively. The power supply terminals 17a and 17b are connected to a power-on detecting circuit 43 provided in the interface chip IF and are also connected to the core chips CC0 to CC7 through the through silicon vias TSV. The power-on detecting circuit 43 detects the supply of power. On detecting the supply of power, the power-on detecting circuit 43 activates a layer address control circuit 45 on the interface chip IF.

The layer address control circuit 45 changes a layer address due to the I/O configuration of the semiconductor device 10 according to the present embodiment. As described above, the semiconductor memory device 10 includes 16 data input/output terminals 14. Thereby, a maximum I/O number can be set to 16 bits (DQ0 to DQ15). However, the I/O number is not fixed to 16 bits and may be set to 8 bits (DQ0 to DQ7) or 4 bits (DQ0 to DQ3). The address allocation is changed according to the I/O number and the layer address is also changed. The layer address control circuit 45 changes the address allocation according to the I/O number and is commonly connected to the core chips CC0 to CC7 through the through silicon vias TSV.

The interface chip IF is also provided with a layer address setting circuit 44. The layer address setting circuit 44 is connected to the core chips CC0 to CC7 through the through silicon vias TSV. The layer address setting circuit 44 is cascade-connected to the layer address generating circuit 46 of the core chips CC0 to CC7 using the through silicon via TSV2 of the type shown in FIG. 2B, and reads out the layer addresses set to the core chips CC0 to CC7 at testing.

The interface chip IF is also provided with a defective chip information holding circuit 33. When a defective core chip that does not normally operates is discovered after an assembly, the defective chip information holding circuit 33 holds its chip number. The defective chip information holding circuit 33 is connected to the core chips CC0 to CC7 through the through silicon vias TSV. The defective chip information holding circuit 33 is connected to the core chips CC0 to CC7 while being shifted, using the through silicon via TSV3 of the type shown in FIG. 2C.

The interface chip IF further includes a test mode register 34 and a test circuit 35. The test mode register 34 is commonly connected to each core chip CC0 to CC7 using the through silicon vias TSV1 of a type illustrated in FIG. 2A. By contrast with this, the test circuit 35 is connected to the core chips CC0 to CC7 while being shifted using the through silicon vias TSV3 of a type illustrated in FIG. 2C.

The test mode register 34 receives a test mode signal TM (IF) and a test layer activation signal TLA from the command decoder/control logic 32 and the mode register 42. These signals are input from the command terminals 12a to 12e and the address terminal 13 as the command signal and the address signal, respectively.

The test mode signal TM (IF) is a signal that indicates whether the semiconductor memory device 10 is set in a parallel test mode set and whether the parallel test outputs its test result in one bit or a plurality of bits. The test mode register 34 generates various test control signals (an on-chip comparison test signal TOCCIF, a parallel test signal TPARADTIF, and a multibit output parallel test signal TPARAPIF) in response to the test mode signal TM (IF), and supplies the test control signals to the test circuit 35. Details of the test control signals are described later.

The test layer activation signal TLA is a signal that designates one or a plurality of core chips to be subject to the parallel test. The test mode register 34 generates an enable signal TLSE and disable signal TLSD in response to a test layer activation signal TLA. Each of the enable signal TLSE and disable signal TLSD has a plural of bits corresponding to the core chips CC0 to CC7 respectively. These enable signal TLSE, disable signal TLSD, and a test clock TLSCLK which is a timing signal are outputted to a test mode register (described later) of each core chip through the through silicon vias TSV1 of a type illustrated in FIG. 2A. Each of the enable signal TLSE, disable signal TLSD and test clock TLSCLK is a signal sent one bit at a time. Consequently, three through silicon vias TSV1 for supplying these signals to the core chips CC0 to CC7 are sufficient per core chip.

Details of the test circuit 35 are described later.

The above description is the outline of the connection relationship between the external terminals and the interface chip IF and the circuit configuration of the interface chip IF. Next, the circuit configuration of the core chips CC0 to CC7 will be described.

As shown in FIG. 4, memory cell arrays 50 that are included in the core chips CC0 to CC7 performing the back-end function are divided into eight banks. A bank is a unit that can individually receive a command. That is, the individual banks can be independently and nonexclusively controlled. From the outside of the semiconductor memory device 10, each back can be independently accessed. For example, a part of the memory cell array 50 belonging to the bank 1 and another part of the memory cell array 50 belonging to the bank 2 are controlled nonexclusively. That is, word lines WL and bit lines BL corresponding to each banks respectively are independently accessed at same period by different commands one another. For example, while the bank 1 is maintained to be active (the word lines and the bit lines are controlled to be active), the bank 2 can be controlled to be active. However, the banks shares the external terminals (for example, plural control terminals and plural I/O terminals) of the semiconductor memory device 10. In the memory cell array 50, the plural word lines WL and the plural bit lines BL intersect each other, and memory cells MC are disposed at intersections thereof (in FIG. 4, only one word line WL, one bit line BL, and one memory cell MC are shown). The word line WL is selected by a row decoder 51. The bit line BL is connected to a corresponding sense amplifier SA in a sense circuit 53. The sense amplifier SA is selected by a column decoder 52.

The row decoder 51 is controlled by a row address supplied from a row control circuit 61. The row control circuit 61 includes an address buffer 61a that receives a row address supplied from the interface chip IF through the through silicon via TSV, and the row address that is buffered by the address buffer 61a is supplied to the row decoder 51. The address signal that is supplied through the through silicon via TSV is supplied to the row control circuit 61 through the input buffer B1. The row control circuit 61 also includes a refresh counter 61b. When a refresh signal is issued by a control logic circuit 63, a row address that is indicated by the refresh counter 61b is supplied to the row decoder 51.

The column decoder 52 is controlled by a column address supplied from a column control circuit 62. The column control circuit 62 includes an address buffer 62a that receives the column address supplied from the interface chip IF through the through silicon via TSV, and the column address that is buffered by the address buffer 62a is supplied to the column decoder 52. The column control circuit 62 also includes a burst counter 62b that counts the burst length.

The sense amplifier SA selected by the column decoder 52 is connected to the data control circuit 54 through a data amplifier 56 and sub-amplifiers which are not shown in the drawings. Thereby, read data of 8 bits (=prefetch number) for each I/O (DQ) is output from the data control circuit 54 at reading, and write data of 8 bits is input to the data control circuit 54 at writing. The data control circuit 54 and the interface chip IF are connected in parallel through the through silicon via TSV.

The control logic circuit 63 receives an internal command ICMD supplied from the interface chip IF through the through silicon via TSV and controls the row control circuit 61 and the column control circuit 62, based on the internal command ICMD. In other words, the control logic circuit 63 is a circuit that controls read/write operation to memory cell array 50 in response to the clock signal, the address signal, and the control signal.

The control logic circuit 63 is connected to a layer address comparison circuit (chip information comparison circuit) 47. The layer address comparison circuit 47 detects whether the corresponding core chip is target of access, and the detection is performed by comparing a SEL (chip selection information) which is a part of the address signal supplied from the interface chip IF through the through silicon via TSV and a layer address LID (chip identification information) set to the layer address generating circuit 46.

In the layer address generating circuit 46, unique layer addresses are set to the core chips CC0 to CC7, respectively, at initialization. A method of setting the layer addresses is as follows. First, after the semiconductor memory device 10 is initialized, a minimum value (0, 0, 0) as an initial value is set to the layer address generating circuits 46 of the core chips CC0 to CC7. The layer address generating circuits 46 of the core chips CC0 to CC7 are cascade-connected using the through silicon vias TSV of the type shown in FIG. 2B, and have increment circuits provided therein. The layer address (0, 0, 0) that is set to the layer address generating circuit 46 of the core chip CC0 of the uppermost layer is transmitted to the layer address generating circuit 46 of the second core chip CC1 through the through silicon via TSV and is incremented. As a result, a different layer address (0, 0, 1) is generated. Hereinafter, in the same way as the above case, the generated layer addresses are transmitted to the core chips of the lower layers and the layer address generating circuits 46 in the core chips increment the transmitted layer addresses. A maximum value (1, 1, 1) as a layer address is set to the layer address generating circuit 46 of the core chip CC7 of the lowermost layer. Thereby, the unique layer addresses are set to the core chips CC0 to CC7, respectively.

The layer address generating circuit 46 is provided with a defective chip signal DEF supplied from the defective chip information holding circuit 33 of the interface chip IF, through the through silicon via TSV. As the defective chip signal DEF is supplied to the individual core chips CC0 to CC7 using the through silicon via TSV3 of the type shown in FIG. 2C, the defective chip signals DEF can be supplied to the core chips CC0 to CC7, individually. The defective chip signal DEF is activated when the corresponding core chip is a defective chip. When the defective chip signal DEF is activated, the layer address generating circuit 46 transmits, to the core chip of the lower layer, a non-incremented layer address, not an incremented layer address. The defective chip signal DEF is also supplied to the control logic circuit 63. When the defective chip signal DEF is activated, the control logic circuit 63 is completely halted. Thereby, the defective core chip performs neither read operation nor write operation, even though an address signal or a command signal is input from the interface chip IF.

An output of the control logic circuit 63 is also supplied to a mode register 64. When an output of the control logic circuit 63 shows a mode register set, the mode register 64 is updated by an address signal. Thereby, operation modes of the core chips CC0 to CC7 are set.

Each of the core chips CC0 to CC7 has an internal voltage generating circuit 70. The internal voltage generating circuit 70 is provided with power supply potentials VDD and VSS. The internal voltage generating circuit 70 receives these power supply potentials and generates various internal voltages. As the internal voltages that are generated by the internal voltage generating circuit 70, an internal voltage VPERI (≈VDD) for operation power of various peripheral circuits, an internal voltage VARY (<VDD) for an array voltage of the memory cell array 50, and an internal voltage VPP (>VDD) for an activation potential of the word line WL are included. In each of the core chips CC0 to CC7, a power-on detecting circuit 71 is also provided. When the supply of power is detected, the power-on detecting circuit 71 resets various internal circuits.

Each of the core chips CC0 to CC7 further includes a test mode register 66 and a test circuit 67. The test mode register 66 receives a test mode signal TM (Core) from the mode register 64, and receives the enable signal TLSE, disable signal TLSD and test clock TLSCLK from the interface chip IF through the through silicon vias TSV1. The test mode signal TM (Core) is a signal that is input from the address terminal 13 as the address signal, indicating a parallel test mode set, similar to the test mode signal TM (IF), and whether to output the test result in one bit or a plurality of bits. The test mode register 66 generates various test control signals (an on-chip comparison test signal TOCC, a parallel test signal TPARADT, and a multibit output parallel test signal TPARAP) in response to the test mode signal TM (Core), and supplies the test control signals to the test circuit 67. Details of the test control signals are described later. The test mode signal TM (Core) is commonly activated in each core chip CC0 to CC7, whereas the test mode signal TM (Core) is enabled in arbitrary core chips CC0 to CC7 by the enable signal TLSE, disable signal TLSD and test clock TLSCLK. The details of the test mode register 66 will be described below.

The test circuit 67 is connected to the test circuit 35 in the interface chip IF via the through silicon via TSV3 of the type shown in FIG. 2C. The test circuit 67, at the time of a parallel test, has a function of reading test data written in advance in a plurality of memory cells to be tested from the data amplifier 56 and comparing the data and a function of outputting a comparison result (a layer test result signal) through different current paths that vary from one core chip to another (a through silicon via path constituted by a plurality of through silicon vias TSV).

The peripheral circuits in the core chips CC0 to CC7 operates in synchronization with the internal clock signal ICLK that is supplied from the interface chip IF through the through silicon via TSV. The internal clock signal ICLK supplied through the through silicon via TSV is supplied to the various peripheral circuits through the input buffer B2.

The above description is the basic circuit configuration of the core chips CC0 to CC7. In the core chips CC0 to CC7, the front end unit for an interface with the external device is not provided. Therefore the core chip cannot operate as a single chip in principle. However, if the core chip never operates as the single chip, an operation test of the core chip in a wafer state may not be performed. This means that the semiconductor memory device 10 cannot be tested, before the interface chip and the plural core chips are fully assembled. In other words, the individual core chips are tested when testing the semiconductor memory device 10. When unrecoverable defect exists in the core chips, the entire semiconductor memory device 10 is led to be unavailable. In this embodiment, in the core chips CC0 to CC7, a portion of a pseudo front end unit, for testing, that includes some test pads TP and a test front end unit of a test command decoder 65 is provided, and an address signal or a command signal can be input from the test pads TP. It is noted that the test front end unit is provided for a simple test in a wafer test, and does not have all of the front end functions in the interface chip. For example, since an operation frequency of the core chips is lower than an operation frequency of the front end unit, the test front end unit can be simply realized with a circuit that performs a test with a low frequency.

The test pads TP include a test pad TP1 supplied with the clock signal, a test pad TP2 supplied with the address signal, test pads TP3 supplied with the command signal, a test pad TP4 for performing input/output of test data, a test pad TP5 for performing input/output of data strobe signal, test pads 6 for supplying power-supply voltages, test pads TP7 for drawing output data of test circuit 67, and a test pad TP8 for supplying a signal PWB indicating a wafer test mode set to the test circuit 67. A wafer test output buffer 68 is provided between the test pads TP7 and the test circuit 67.

A common external command (not decoded) is input at testing. Therefore, the test command decoder 65 is also provided in each of the core chips CC0 to CC7. Because serial test data is input and output at testing, a test input/output circuit 55 is also provided in each of the core chips CC0 to CC7.

This is the entire configuration of the semiconductor memory device 10. Because in the semiconductor memory device 10, the 8 core chips of 1 Gb are laminated, the semiconductor memory device 10 has a memory capacity of 8 Gb in total. Because the chip selection signal /CS is input to one terminal (chip selection terminal), the semiconductor memory device is recognized as a single DRAM having the memory capacity of 8 Gb, in view of the controller.

Figure 5:
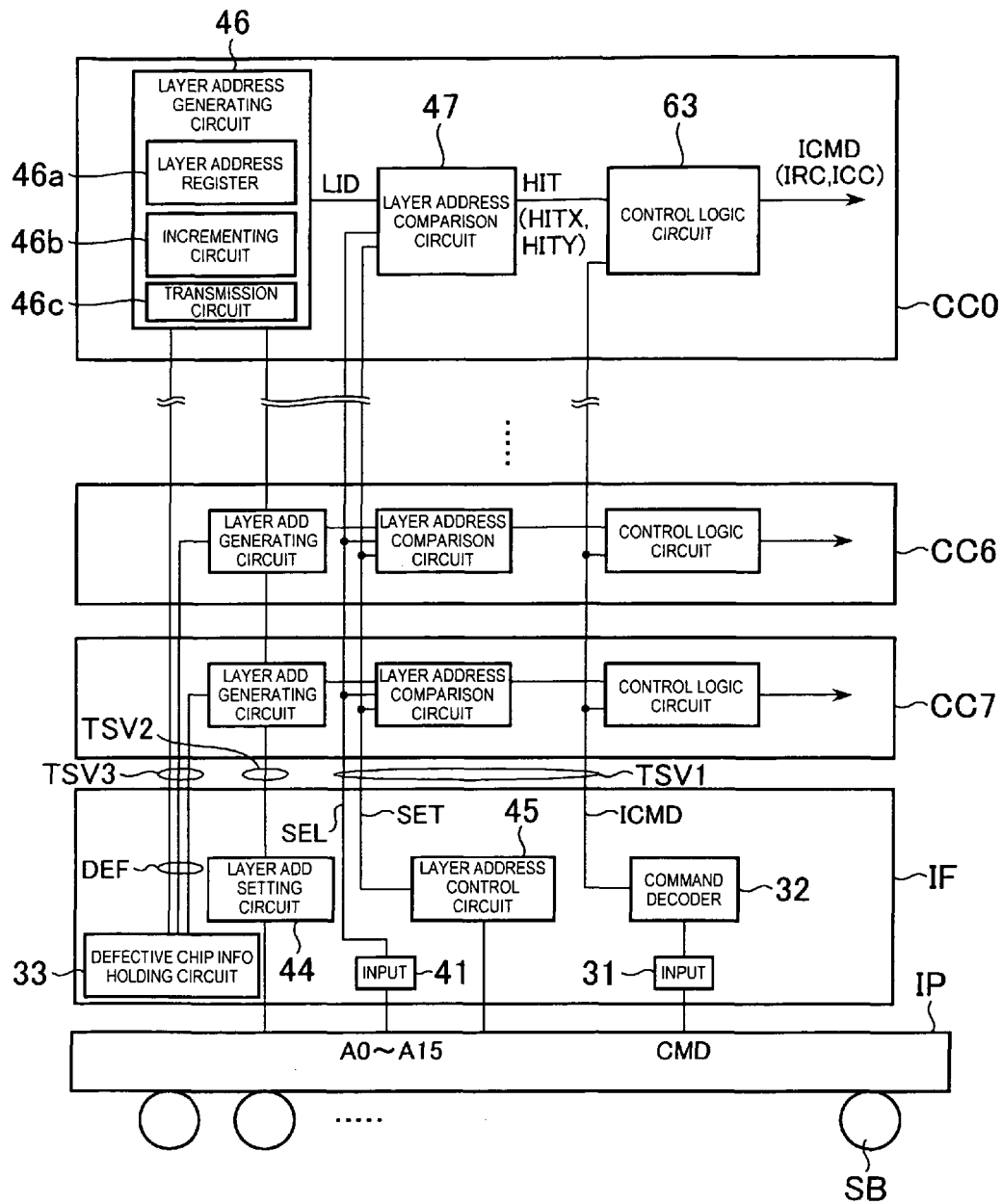
FIG. 5 is a diagram showing a circuit associated with selection of the core chips CC0 to CC7.

FIG. 5 is a diagram showing a circuit associated with selection of the core chips CC0 to CC7.

As shown in FIG. 5, the layer address generating circuits 46 are provided in the core chips CC0 to CC7, respectively, and are cascade-connected through the through silicon via TSV2 of the type shown in FIG. 2B. The layer address generating circuit 46 includes a layer address register 46a, an increment circuit 46b, and a transmission circuit 46c.

The layer address register 46a holds a layer address (chip identification information) LID of 3 bits. When the power supply is detected by the power-on detecting circuit 71 shown in FIG. 4, a register value is initialized to a minimum value (0, 0, 0). In the core chip CC0 of the uppermost layer, the increment circuit 46b increments a layer address LID (0, 0, 0) in the layer address register 46a and the incremented value (0, 0, 1) is transmitted to the core chip CC1 of the lower layer by the transmission circuit 46c. The transmitted layer address LID (0, 0, 1) is set to the layer address register 46a of the core chip CC1.

Even in the core chip CC1, a value (0, 1, 0) that is obtained by incrementing the layer address LID (0, 0, 1) in the layer address register 46a by the increment circuit 46b is transmitted to the core chip CC2 of the lower layer by the transmission circuit 46c.

Hereinafter, in the same way as the above case, the incremented layer addresses LID are sequentially transmitted to the core chips of the lower layers. Finally, a maximum value (1, 1, 1) is set to the layer address register 46a of the core chip CC7 of the lowermost layer. Thereby, each of the core chips CC0 to CC7 has a unique layer address LID.

A defective chip signal DEF is supplied from the defective chip information holding circuit 33 of the interface chip IF to the layer address generating circuit 46 through the through silicon via TSV3 of the type shown in FIG. 2C. The defective chip signal DEF is a signal of 8 bits and the bits are supplied to the corresponding core chips CC0 to CC7. The core chip where the corresponding bits of the defective chip signal DEF is activated is the defective chip. In the core chip where the corresponding bits of the defective chip signal DEF is activated, the transmission circuit 46c transmits, to the core chip of the lower layer, a non-incremented layer address LID, not an incremented layer address LID. Accordingly, in the allocating process of the layer address LID, the defective chip is skipped. That is, the layer address LID that is allocated to each of the core chips CC0 to CC7 is not fixed and changes according to the defective chip signal DEF. The same layer address LID as the lower layer is allocated to the defective chip. However, since the control logic circuit 63 is prohibited from being activated in the defective chip, a read operation or a write operation is not securely performed, even though an address signal or a command signal is input from the interface chip IF.

The layer address LID is further supplied to the layer address comparison circuit (chip information comparison circuit) 47 in each of the core chips CC0 to CC7. The layer address comparison circuit 47 compares the layer address LID (chip identification information) supplied from the layer address generating circuit 46 and a portion of the address signal (chip selection information SEL) supplied from the interface chip IF through the through silicon via TSV. As the address signal is commonly supplied to the core chips CC0 to CC7 through the through silicon via TSV1 of the type shown in FIG. 2A, the core chip where matching is detected as a comparison result by the layer address comparison circuit 47 is only one.

The address signal supplied form the interface chip IF includes a row address and a column address, and the row address and the column address are supplied to the core chips CC0 to CC7 in order of the row address and the column address. Accordingly, when the all of chip selection information SEL is included in the row address, the comparison operation is completed when the row address is input. Meanwhile, when a portion of the chip selection information SEL is included in the row address and a remaining portion of the chip selection information SEL is included in the column address, the comparison operation is not completed when the row address is input and is completed when the column address is input.

A portion of the address signal that is used as the chip selection information SEL depends on the I/O configuration. That is, the chip selection information SEL is not fixed and changes according to the I/O configuration. In this case, the I/O configuration indicates the configuration of the number of bits of external unit data that is simultaneously input and output between the semiconductor memory device and the external device. In this embodiment, the 16-bit configuration (DQ0 to DQ15), the 8-bit configuration (DQ0 to DQ7), and the 4-bit configuration (DQ0 to DQ3) can be selected as the I/O configuration. The I/O configuration can be selected by fuse cutting or a bonding option.

FIG. 6 is a table illustrating allocation of an address according to the I/O configuration.

As shown in FIG. 6, when the 16-bit configuration (16 DQ) is selected, bits A0 to A15 of an address signal are used as row addresses X0 to X15 and the bits A0 to A9 are used as column addresses Y0 to Y9. Among them, the row addresses X13 to X15 are used as the chip selection information SEL. Accordingly, when the 16-bit configuration (16 DQ) is selected, the chip selection information SEL is fixed at inputting the row address.

When the 8-bit configuration (8 DQ) is selected, the bits A0 to A15 of the address signal are used as the row addresses X0 to X15 and the bits A0 to A9 and A11 are used as the column addresses Y0 to Y9 and Y11. Among them, the row addresses X14 and X15 and the column address Y11 are used as the chip selection information SEL. When the 4-bit configuration (4 DQ) is selected, the bits A0 to A15 of the address signal are used as the row addresses X0 to X15 and the bits A0 to A9, A11, and A13 are used as the column addresses Y0 to Y9, Y11, and Y13. Among them, the row addresses X14 and X15 and the column address Y13 are used as the chip selection information SEL. Accordingly, when one of the 8-bit configuration (8 DQ) and the 4-bit configuration (4 DQ) is selected, the chip selection information SEL is not fixed before both the row address and the column address are input.

Referring back to FIG. 5, the layer address control circuit 45 uses a designation signal SET to designate a portion of the address signal used as the chip selection information SEL, according to the selected I/O configuration. The designation signal SET is commonly supplied to the layer address comparison circuits 47 of the core chips CC0 to CC7 through the through silicon via TSVs. The layer address comparison circuit 47 compares the layer address LID supplied from the layer address generating circuit 46 and the chip selection information SEL supplied from the interface chip IF and activates a matching signal HIT, when the layer address LID and the chip selection information SEL are matched with each other. The matching signal HIT is supplied to the control logic circuit 63 in the corresponding core chip. The control logic circuit 63 is activated by the matching signal HIT and validates internal commands ICMD that are supplied from the interface chip IF through the through silicon via TSV. Among the validated internal commands, an internal row command IRCMD is supplied to the row control circuit 61 shown in FIG. 1 and an internal column command ICCMD is supplied to the column control circuit 62 shown in FIG. 1. In case the matching signal HIT is not activated, the control logic circuit 63 invalidates the internal commands ICMD. Accordingly, the internal commands ICMD that are commonly supplied to the core chips CC0 to CC7 are validated in any one of the core chips CC0 to CC7.

Figure 7:
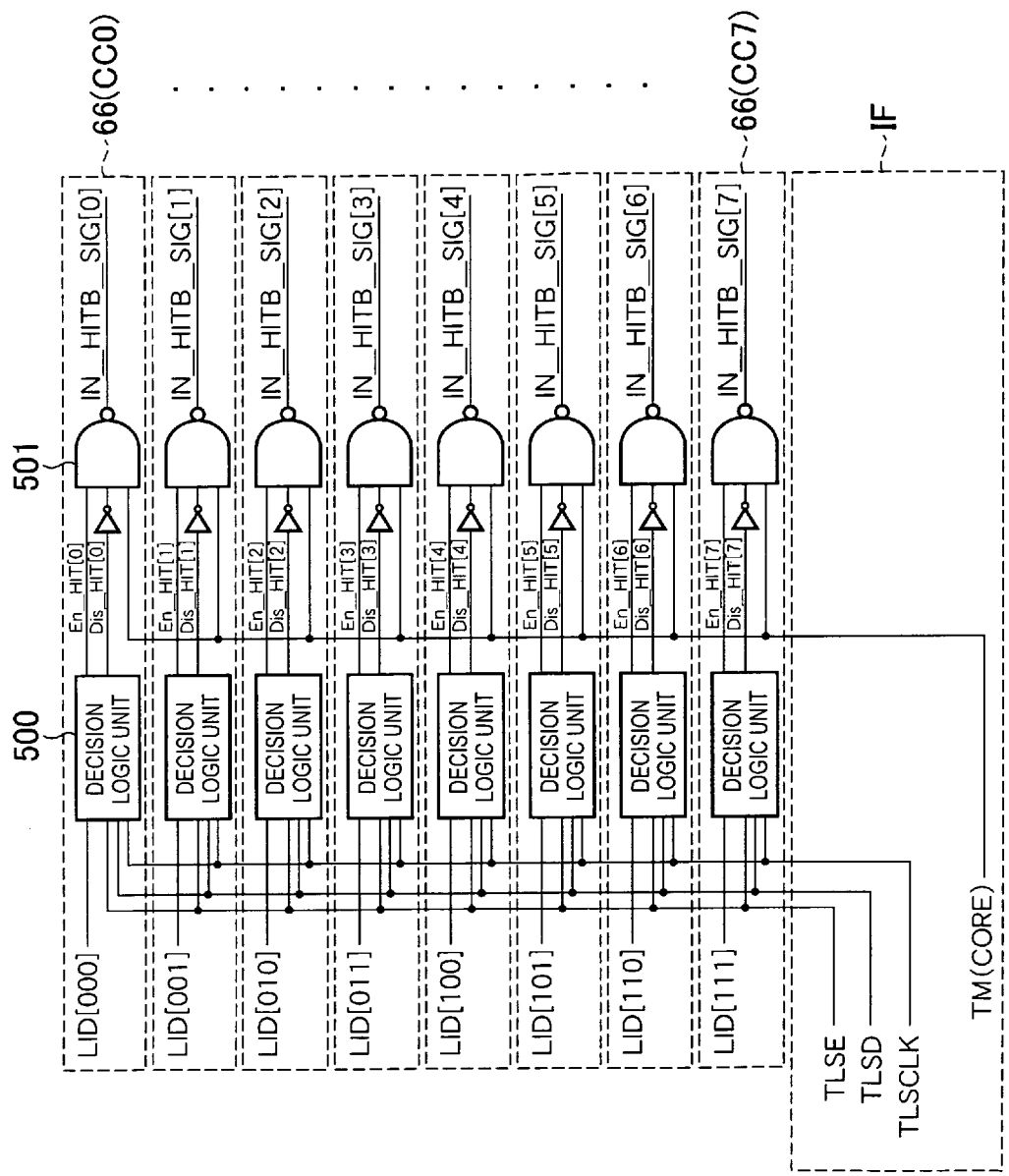
FIG. 7 is a block diagram illustrating a circuit configuration of a main part of the test mode register 66.

FIG. 7 is a block diagram illustrating a circuit configuration of a main part of the test mode register 66.

As illustrated in FIG. 7, the test mode register 66 provided for each core chip CC0 to CC7 includes a decision logic unit 500. The decision logic unit 500 receives the layer address LID of a corresponding core chip, enable signal TLSE, disable signal TLSD and test clock TLSCLK. As described above, because the layer address LID has a value unique to each core chip CC0 to CC7, the layer address LID supplied to the decision logic unit 500 varies between the core chips. By contrast with this, the enable signal TLSE, disable signal TLSD and test clock TLSCLK are common between each core chip CC0 to CC7 because these signals are supplied through the through silicon vias TSV1 of the type illustrated in FIG. 2A. With this specification, a through silicon via for supplying the enable signal TLSE is referred to as "a first through silicon via", and a current path including at least a first through silicon via is referred to as "a first current path". Similarly, a through silicon via for supplying the test clock TLSCLK is referred to as "a second through silicon via" and a current path including at least a second through silicon via is referred to as "a second current path". A through silicon via for supplying the disable signal TLSD is referred to as "a third through silicon via" and a current path including at least a third through silicon via is referred to as "a third current path".

The decision logic unit 500 generates an enable hit signal En_HIT[i] (where i is a core chip number of 0 to 7), and a disable hit signal Dis_HIT[i], based on these input signals. These enable hit signal En_HIT[i] and disable hit signal Dis_HIT[i] are inputted to a NAND gate circuit 501 with the test mode signal TM (Core). The hit signal IN_HITB_SIG[i] which is an output of the NAND gate circuit 501 is an activation signal of the test mode register 66. A parallel test is conducted at the core chip in which this signal is activated at a low level. The parallel test is not conducted at the core chip in which the hit signal IN_HITB_SIG[i] is deactivated at a high level.

Figure 8:
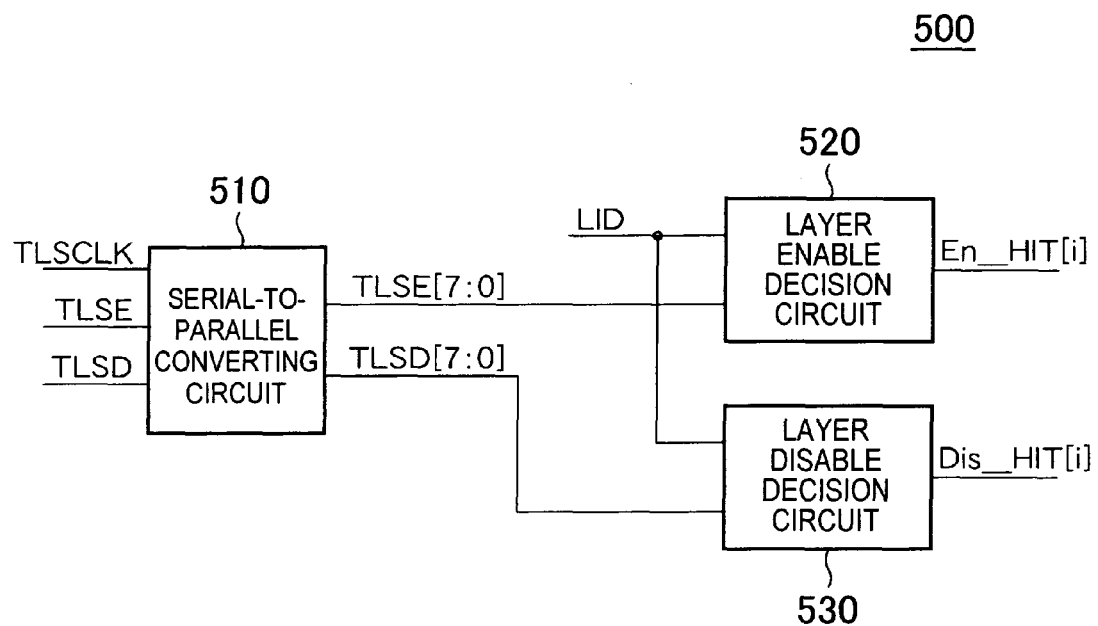
FIG. 8 is a block diagram of the decision logic unit 500.

FIG. 8 is a block diagram of the decision logic unit 500.

As illustrated in FIG. 8, the logic decision unit 500 includes a serial-to-parallel converting circuit 510, a layer enable decision circuit 520 and a layer disable decision circuit 530.

The serial-to-parallel converting circuit 510 converts the enable signal TLSE and disable signal TLSD which are serially supplied in synchronization with the test clock TLSCLK to parallel signals. The converted enable signal TLSE is supplied to the layer enable decision circuit 520 as 8 bit enable signal TLSE [7:0], and the converted disable signal TLSD is supplied to the layer disable decision circuit 530 as a 8 bit disable signal TLSD [7:0].

The enable signal TLSE [7:0] consists of the enable signals TLSE[0] to TLSE[7]. The layer enable decision circuit 520 selects a bit (signal) corresponding to the layer address (chip identification information) LID assigned to the corresponding core chip out of the enable signals TLSE[0] to TLSE[7]. And the layer enable decision circuit 520 generates an enable hit signal En_HIT[i] based on a logic level of the selected bit. Similarly, the disable signal TLSD[7:0] consists of the disable signals TLSD[0] to TLSD[7]. The layer disable decision circuit 530 selects a bit (signal) corresponding to the layer address (chip identification information) LID assigned to the corresponding core chip out of the disable signals TLSD[0] to TLSD[7]. And the layer disable decision circuit 530 generates a disable hit signal Dis_HIT[i] based on a logic level of the selected bit.

Figure 9:
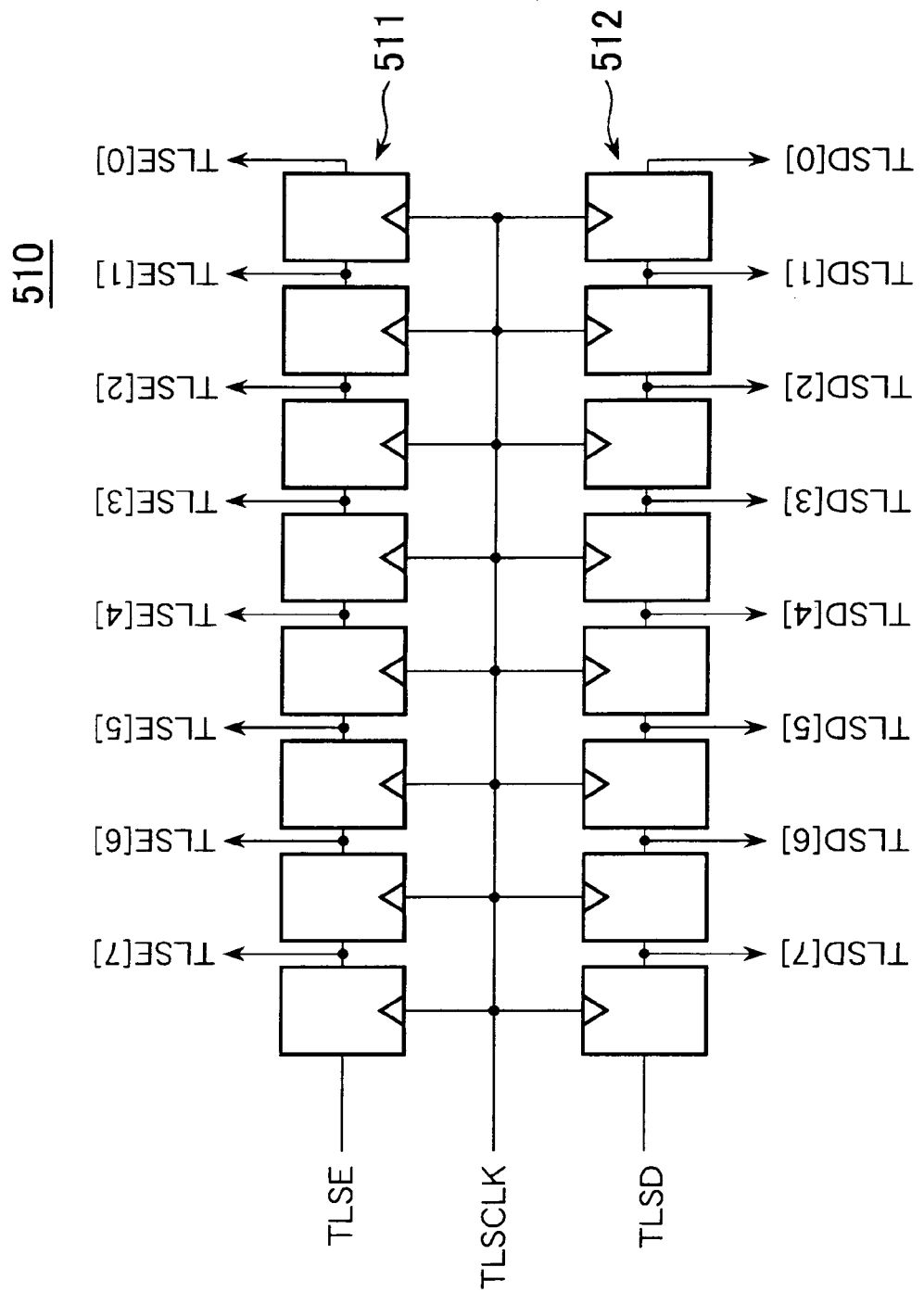
FIG. 9 is a circuit diagram of the serial-to-parallel converting circuit 510.

FIG. 9 is a circuit diagram of the serial-to-parallel converting circuit 510.

As illustrated in FIG. 9, the serial-to-parallel converting circuit 510 consists of 8 bit shift registers 511 and 512 each having 8 latch circuits connected in cascade. The enable signal TLSE is supplied to the first stage latch circuit of the shift register 511, and is transferred sequentially to a latch circuit at a sequent stage in synchronization with the test clock TLSCLK. Similarly, a disable signal TLSD is supplied to a first stage latch circuit of the shift register 512, and is transferred sequentially to a latch circuit at a subsequent stage in synchronization with the test clock TLSCLK. The outputs of the latch circuits that make up the shift register 511 are used as the enable signals TLSE[0] to TLSE[7], and the outputs of the latch circuits that make up the shift register 512 are used as the disable signals TLSD[0] to TLSD[7]. According to this configuration, the enable signal TLSE and disable signal TLSD serially supplied in synchronization with the test clock TLSCLK are converted into parallel signals by the serial-to-parallel converting circuit 510.

Figure 10:
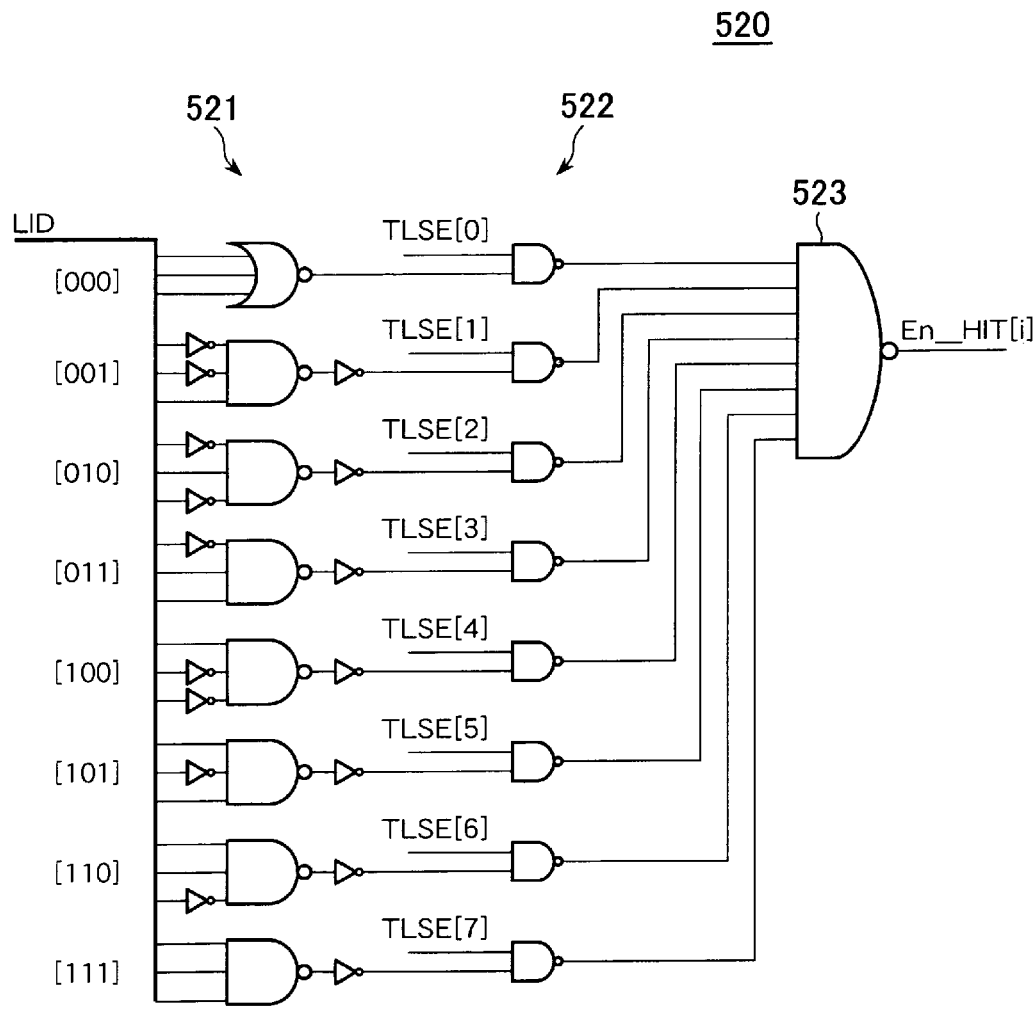
FIG. 10 is a circuit diagram of the layer enable decision circuit 520.

FIG. 10 is a circuit diagram of the layer enable decision circuit 520.

As illustrated in FIG. 10, the layer enable decision circuit 520 includes decoders 521 which decode the layer addresses LID, comparison circuits 522 each of which receives the corresponding bit of the decode signal output from the decoders 521 and the corresponding one (1 bit signal) of the enable signals TLSE[0] to TLSE[7], and a NAND gate circuit 523 which generates an enable hit signal En_HIT[i] based on the outputs of the comparison circuits 522.

The decode signal output from the decoders 521 is an 8 bit signal. Since the layer addresses LID are different from one core chip to another, the bit out of the 8 bits which becomes active (high level) vary by the core chips CC0 to CC7. The decode signal output from the decoders 521 is supplied to the comparison circuits 522, and each bit of the decode signal and the corresponding one of the enable signals TLSE[0] to TLSE[7] are compared by the NAND gate circuit. As a result, if both of them are high levels, the output of the NAND gate circuit becomes a low level. As a result, the enable hit signal En_HIT[i] output from the NAND gate circuit 523 which has 8 inputs is activated at a high level. Here, because the number of bits which becomes a high level out of the 8 bit of the decode signal output from the decoders 521 is only one, it can be said that each of the comparison circuits 522 decides whether the corresponding enable signal TLSE[i] is a high level or not.

The layer disable decision circuit 530 has a circuit configuration similar to that of the layer enable decision circuit 520 mentioned above. Therefore, description thereof will not be repeated.

Figure 11:
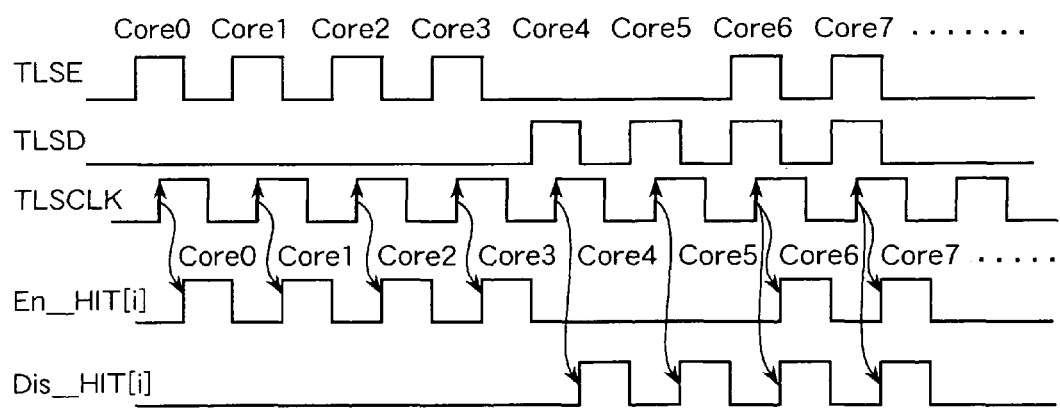
FIG. 11 is a timing chart for describing the operation of the decision logic unit 500.

FIG. 11 is a timing chart for describing the operation of the decision logic unit 500.

With the example illustrated in FIG. 11, the zeroth to the seventh active edges of the test clock TLSCLK are used for specifying the core chips CC0 to CC7 respectively. Further, in synchronization with the zeroth to the third, sixth and seventh active edges, the enable signal TLSE are activated, and, in synchronization with the fourth to the seventh active edges, the disable signal TLSD is activated.

The enable signal TLSE and disable signal TLSD are commonly supplied to each core chip CC0 to CC7 serially from the interface chip IF, and converted to parallel signals by the serial-to-parallel converting circuit 510. Further, in each of the core chips, only one bit corresponding to the core chip is validated due to the operation of the layer enable decision circuit 520 and layer disable decision circuit 530. As a result, the enable hit signal En_HIT is activated in the core chips CC0 to CC3, CC6 and CC7, and the disable hit signal Dis_HIT is activated in the core chips CC4 to CC7.

The enable hit signal En_HIT[i] and disable hit signal Dis_HIT[i] generated in this way are supplied to the NAND gate circuit 501 illustrated in FIG. 7. In this regard, the disable hit signal Dis_HIT[i] is inverted by an inverter before being supplied to the NAND gate circuit 501. By this means, under the condition that the enable hit signal En_HIT[i] is activated and the disable hit signal Dis_HIT[i] is deactivated, the hit signal IN_HITB_SIG[i] is activated. By contrast with this, when the enable hit signal En_HIT[i] is deactivated or when both of the enable hit signal En_HIT[i] and disable hit signal Dis_HIT[i] are activated, the hit signal IN_HITB_SIG[i] is deactivated.

Hence, with the example illustrated in FIG. 11, the core chips CC0 to CC3 becomes targets of a parallel test, whereas the core chips CC4 to CC7 does not become targets of the parallel test. This selection is arbitrarily made based on the serially supplied enable signal TLSE and disable signal TLSD, and the arbitrary number of core chips and an arbitrary combination of the core chips may become targets of a parallel test.

Further, with the present embodiment, since the one or more core chips which are targets of a parallel test out of the core chips CC0 to CC7 are selected by serially supplying the 3 bit signals which are the enable signal TLSE, the disable signal TLSD and the test clock TLSCLK, three through silicon vias is enough to select the core chips. Furthermore, since the first to the third through silicon vias to be used are the through silicon vias TSV1 of the type illustrated in FIG. 2A, it is possible to use through silicon vias which are not used during the test, for example, part of through silicon vias which transmit and receive data DQ. In this case, it is not necessary to prepare dedicated through silicon vias.

As described above, according to the present embodiment, it is possible to reduce the number of through silicon vias required to select the core chips CC0 to CC7 which are targets of a parallel test.

Hereinafter, each circuit for actually conducting a parallel test will be described.

Figure 12:
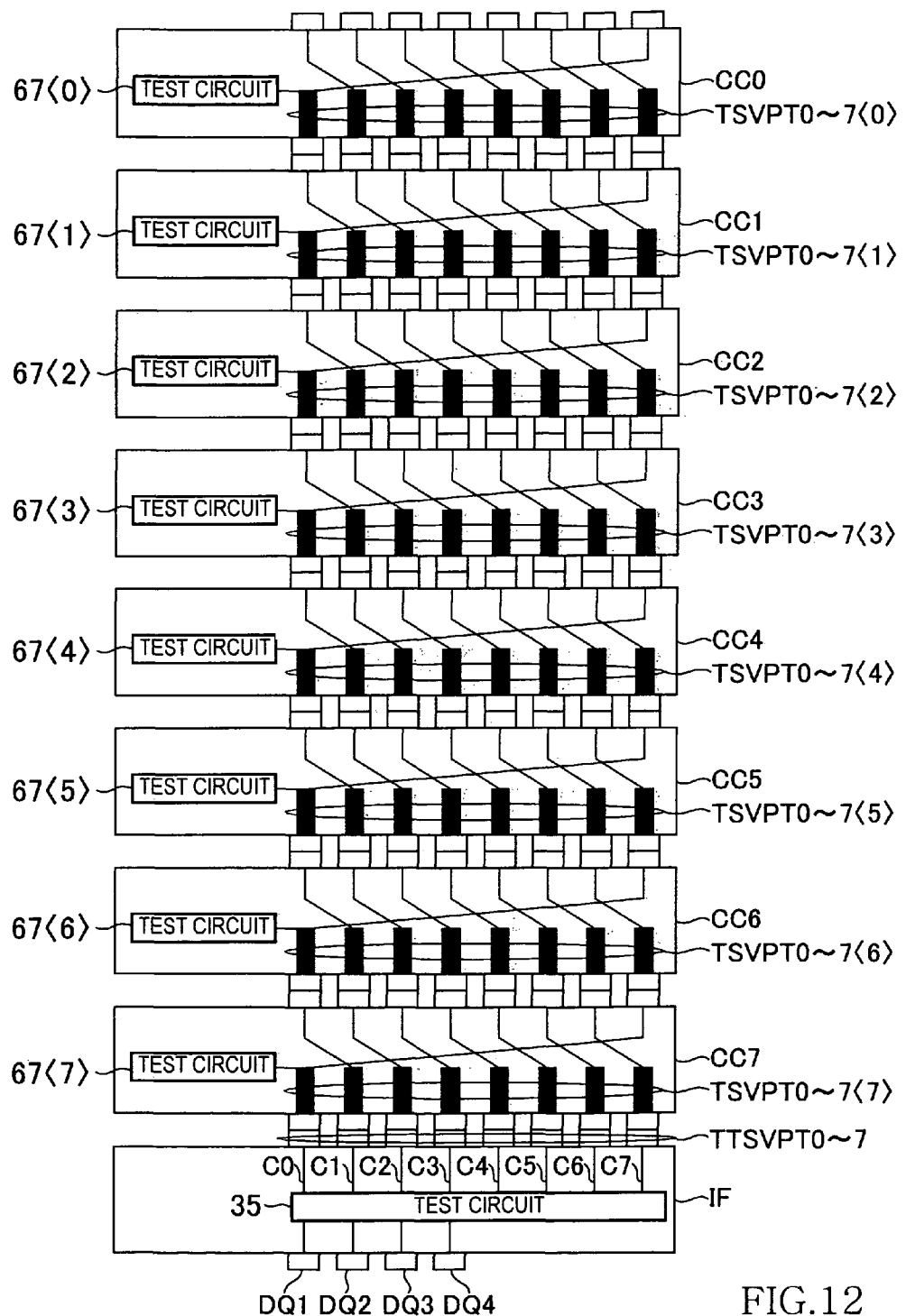
FIG. 12 is a schematic cross section of a circuit including the through silicon via group (a spirally-connected through silicon via group) connecting the test circuits provided in the core chips and the test circuit provided in the interface chip.

FIG. 12 is a schematic cross section of a circuit including the through silicon via group TSV3 that constitutes current paths C0 to C7 connecting the test circuit 35 and the test circuit 67. As shown in FIG. 5, through silicon vias for parallel test TSVPTm<n> provided in each of the core chips are included in the through silicon via TSV group 3, where m and n are integers from 0 to 7. In a similar manner, there may be a case that it is indicated that a structure corresponds to a core chip CCn by attaching <n>. With this specification, a through silicon via for parallel test TSVPTm<n> are referred to as "a fourth through silicon via" and a current path including at least a fourth through silicon via is referred to as "a fourth current path".

The through silicon vias for parallel test TSVPTm<n> are arranged at the same position in a planar view for each of the value m. In each core chip CCn, the through silicon vias for parallel test TSVPTm<n> are arranged at regular intervals in the order from the through silicon via for parallel test TSVPT0<n> to the through silicon via for parallel test TSVPT7<n> from the left in FIG. 12. The test circuits 67<n> arranged in the core chip CCn are respectively connected to the through silicon vias for parallel test TSVPT0<n>.

The through silicon via for parallel test TSVPTm<0> (m=0 to 6) provided on the core chip CC0 is connected to a through silicon vias for parallel test TSVPT(m+1)<1> provided on the core chip CC1 that is located right below the core chip CC0, respectively. The through silicon via for parallel test TSVPT7<0> is connected to the through silicon via for parallel test TSVPT0<1>. The same is true for the through silicon vias for parallel test TSVPTm<n> provided on the core chips CC1 to CC6.

The interface chip IF includes through silicon via terminals for parallel test TTSVPT0 to TTSVPT7. The through silicon via terminals for parallel test TTSVPT0 to TTSVPT7 are respectively connected to the through silicon vias for parallel test TSVPT0<7> to TSVPT7<7> provided on the core chip CC7.

The above connections are summarized as: the through silicon via terminal for parallel test TTSVPT0, the through silicon via for parallel test TSVPT0<7>, the through silicon via for parallel test TSVPT7<6>, through silicon via for parallel test TSVPT6<5>, the through silicon via for parallel test TSVPT5<4>, the through silicon via for parallel test TSVPT4<3>, the through silicon via for parallel test TSVPT3<2>, the through silicon via for parallel test TSVPT2<1>, and the through silicon via for parallel test TSVPT1<0> are sequentially connected, by which the current path C0 is constituted. The current path 0 is connected to the test circuit 67<7> via the through silicon vias for parallel test TSVPT0<7>. The same is true for the other current paths C1 to C7, in which the current paths C1 to C7 are respectively connected to the test circuits 67<6> to 67<0> via the through silicon vias for parallel test TSVPT0<6> to TSVPT0<0>.

In this manner, by constituting the current paths C0 to C7 that connect the test circuit 35 and the test circuit 67 with the spirally-connected through silicon via TSV group, the test circuits 67 of the core chips can output the test data from different current paths from each other. Therefore, it is possible to output the layer test result signals of the core chips all together, shortening the time required for the test, as compared to the case of sequentially outputting the test data. In addition, employing the spiral connection makes it possible to take the same configuration for each of the core chips.

Figure 13:
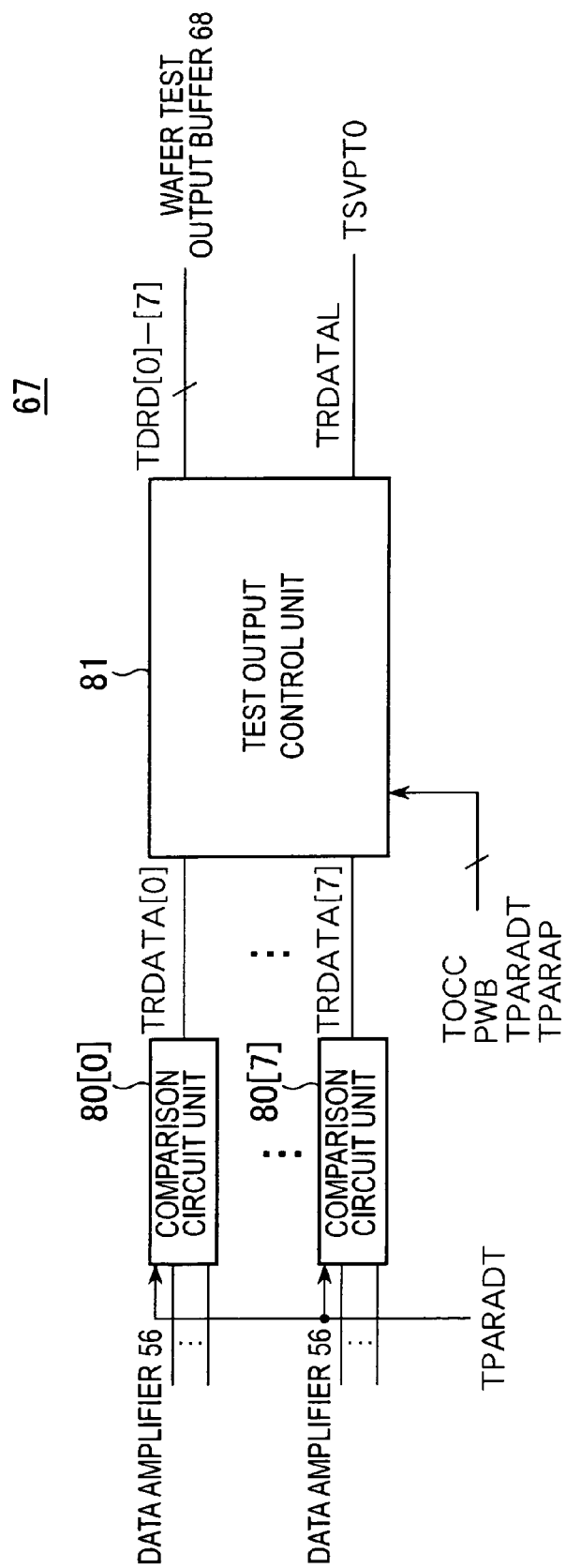
FIG. 13 is a block diagram showing functional blocks of the test circuits provided in the core chips.

FIG. 13 is a block diagram showing functional blocks of the test circuit 67. As shown in FIG. 6, the test circuit 67 includes a plurality of comparison circuit units 80[0] to 80[7] (eight units in the example shown in FIG. 6) and a test output control unit 81.

To each of the comparison circuit units 80, test data stored in a predetermined number of memory cells designated in advance are supplied from the data amplifier 56, and the parallel test signal TPARADT is supplied from the test mode register 66. The parallel test signal TPARADT is a signal that is in an activated (hereinafter called 'ACT') state while the parallel test is being executed, and in a non-activated (hereinafter called 'NAT') state otherwise. When the parallel test signal TPARADT is in the ACT state, each of the comparison circuit units 80 compresses the data amount of a plurality of test data read out from a memory cell by replacing the test data with one comparison result, and eventually outputs the compressed data to the test output control unit 81 as data of a predetermined number of bits. On the other hand, when the parallel test signal TPARADT is in the NAT state, an output of each of the comparison circuit units 80 becomes a predetermined value regardless of the test data, for example, the high level.

Figure 14:
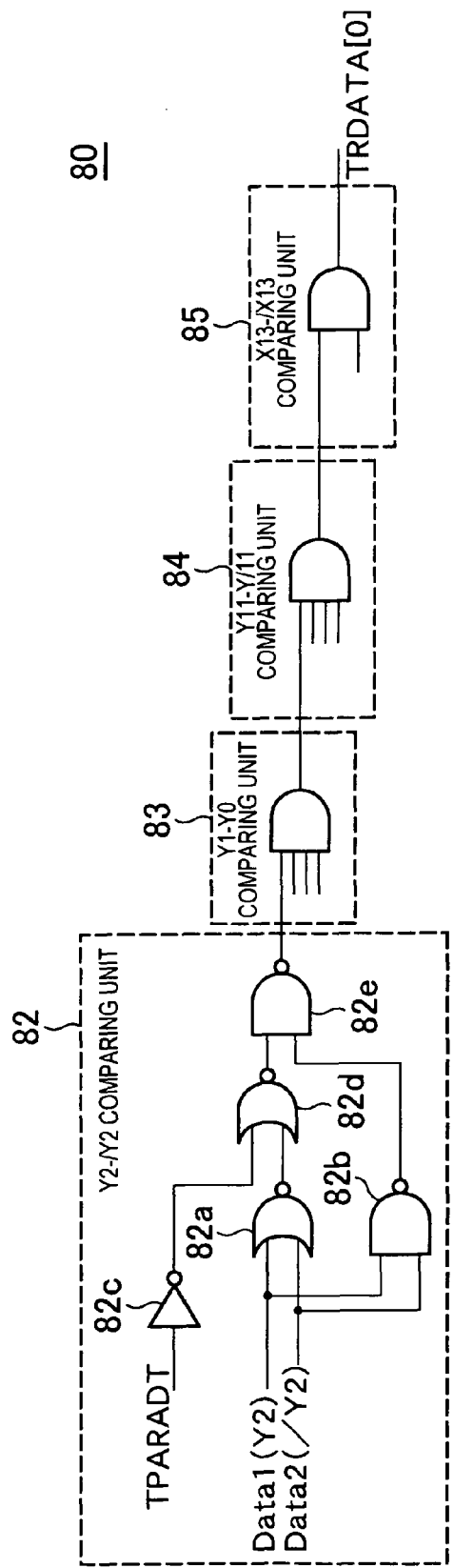
FIG. 14 is a block diagram showing an example of the comparison circuit units provided in the core chips.

FIG. 14 is a block diagram showing an example of the comparison circuit unit 80. As shown in FIG. 14, the comparison circuit unit 80 compares a plurality of test data supplied from the memory cell array via the data amplifier 56 at multiple stages.

When performing the parallel test, a predetermined test data pattern is written in advance in a memory cell to be tested. In this example, a data pattern in which all data are the same (high level or low level) is used as the test data pattern. The comparison circuit unit 80 includes Y2-/Y2 comparing units 82, Y1-Y0 comparing units 83, Y11-/Y11 comparing units 84, and an X13-/X13 comparing unit 85, and performs a 4-stage comparing operation using these comparing units.

Each of the Y2-/Y2 comparing units 82 compares data (Data1 (Y2) and Data2 (/Y2)) stored in two memory cells designated in advance. Specifically, each of the Y2-/Y2 comparing units 82 compares the data (Data1 (Y2) and Data2 (/Y2)) stored in memory cells in which only a predetermined bit (Y2) of a column address is different. A specific configuration of the Y2-/Y2 comparing unit 82 includes, as shown in FIG. 14, a NOR circuit 82a and a NAND circuit 82b to which the Data1 (Y2) and the Data2 (/Y2) are supplied, respectively, a NOT circuit 82c to which the parallel test signal TPARADT is supplied, a NOR circuit 82d to which an output of the NOR circuit 82a and an output of the NOT circuit 82c are supplied, and a NAND circuit 82e to which an output of the NAND circuit 82b and an output of the NOR circuit 82d are supplied. By operations of these circuits, an output of the Y2-/Y2 comparing unit 82 (an output of the NAND circuit 82e) is non-activated only when the parallel test signal TPARADT is activated and the Data1 (Y2) and the Data2 (/Y2) are different from each other, and activated otherwise.

Among outputs of the Y2-/Y2 comparing units 82, outputs in which a predetermined bit of a column address (Y1 and Y0) is different from each other are compared in the Y1-Y0 comparing units 83 at the second stage. Among outputs of the Y1-Y0 comparing units 83, outputs in which a predetermined bit of a column address (Y11) is different from each other are compared in the Y11-/Y11 comparing units 84 at the third stage. Outputs of the Y11-/Y11 comparing units 84 are further compared in the X13-/X13 comparing unit 85 at the fourth stage. Finally, a comparison result of the X13-/X13 comparing unit 85 becomes an output TRDATA[k] (k=0 to 7) of the comparison circuit unit 80. The comparison result TRDATA is a 1-bit data.

The comparison circuit unit 80 is arranged at a rate of one per two ½ banks, which makes a total of eight comparison circuit units 80 per core chip.

Referring back to FIG. 13, the on-chip comparison test signal TOCC, the parallel test signal TPARADT, the multibit output parallel test signal TPARAP, and a signal PWB that indicates a wafer test mode set are input to the test output control unit 81, as well as comparison results TRDATA[0] to TRDATA[7] (total of 8-bit data) output from the comparison circuit units 80[0] to 80[7]. The on-chip comparison test signal TOCC is a signal that is, for example, in the ACT state while a test (a 1-bit output test) in which the test result is output in one bit, such as a burn-in test, is being executed and in the NAT state while a test (a multibit output test) in which the test result is output in a plurality of bits is being executed. On the other hand, the multibit output parallel test signal TPARAP is a signal that is in the NAT state while the 1-bit output test is being executed and in the ACT state while the multibit output test is being executed. The signal PWB is a signal that is in the ACT state when performing a wafer test of each of the core chips and in the NAT state when performing a post-assembly test.

When the signal PWB is in the ACT state (the wafer test), the test output control unit 81 generates layer test result signals TDRD[0] to TDRD[7] based on the comparison results TRDATA[0] to TRDATA[7] of the comparison circuit units 80[0] to 80[7]. At this time, if the on-chip comparison test signal TOCC is in the NAT state (the multibit output test) and if the multibit output parallel test signal TPARAP is in the ACT state (the multibit output test), the test output control unit assigns the comparison results TRDATA[0] to TRDATA[7] to the layer test result signals TDRD[0] to TDRD[7], respectively. On the other hand, if the on-chip comparison test signal TOCC is in the ACT state (the 1-bit output test) and if the multibit output parallel test signal TPARAP is in the NAT state (the 1-bit output test), the test output control unit 81 generates a 1-bit layer test result signal based on the comparison results TRDATA[0] to TRDATA[7], and assigns this layer test result signal to all the layer test result signals TDRD[0] to TDRD[7]. Therefore, in this case, the layer test result signals TDRD[0] to TDRD[7] become the same data. The test output control unit 81 outputs the layer test result signals TDRD[0] to TDRD[7] generated in the above manner to the test pad TP7 via the wafer test output buffer 68.

On the other hand, when the signal PWB is in the NAT state (the post-assembly test), the test output control unit 81 generates a 1-bit layer test result signal TRDATAL<n> based on the comparison results TRDATA[0] to TRDATA[7] of the comparison circuit units 80[0] to 80[7], and outputs the layer test result signal TRDATAL<n> to the through silicon vias for parallel test TSVPT0<n>.

Figure 15:
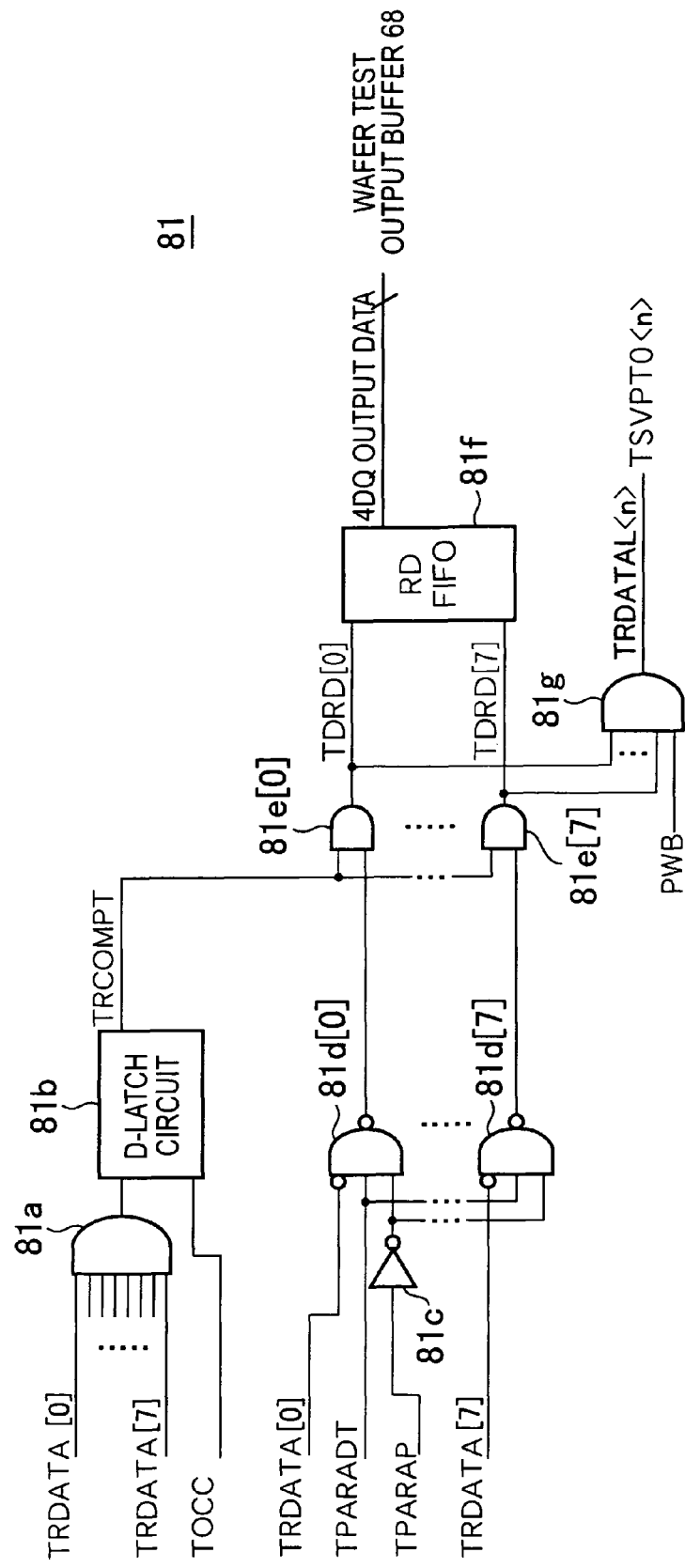
FIG. 15 is a block diagram showing an example of the test output control units provided in the core chips.

FIG. 15 is a block diagram showing an example of the test output control unit 81. In this example, the on-chip comparison test signal TOCC and the parallel test signal TPARADT are high-active signals and the multibit output parallel test signal TPARAP and the signal PWB are low-active signals.

As shown in FIG. 15, the test output control unit 81 includes an AND circuit 81a to which the comparison results TRDATA[0] to TRDATA[7] are supplied, a D-Latch circuit 81b to which an output of the AND circuit 81a and the on-chip comparison test signal TOCC are input, a NOT circuit 81c to which the multibit output parallel test signal TPARAP is supplied, NAND circuits 81d[0] to 81d[7] to which an output of the NOT circuit 81c, the parallel test signal TPARADT, and inverted data of the comparison results TRDATA[0] to TRDATA[7] are respectively supplied, AND circuits 81e[0] to 81e[7] to which an output TRCOMPT (1 DQ) of the D-Latch circuit 81b and outputs of the NAND circuits 81d[0] to 81d[7] are respectively supplied, an RDFIFO 81f to which each of output signals TDRD[0] to TDRD[7] of the AND circuits 81e[0] to 81e[7] is supplied, and an AND circuit 81g to which each of the output signals TDRD[0] to TDRD[7] of the AND circuits 81e[0] to 81e[7] and the signal PWB are supplied. Among these circuits, the D-Latch circuit 81b is a circuit that outputs a high level signal when the on-chip comparison test signal. TOCC is the low level (the NAT state) and an output of the AND circuit 81a when the on-chip comparison test signal TOCC is the high level (the ACT state). The RDFIFO 81f is a circuit that is synchronized with rising and falling of the internal clock signal ICLK, converts the output signals TDRD[0] to TDRD[7] into 4 DQ data, and outputs the converted data.

Table 1 shows a relation between the signal PWB, the on-chip comparison test signal TOCC, the parallel test signal TPARADT, the multibit output parallel test signal TPARAP, an output destination of the layer test result signal, and the number of output bits. When performing a multibit output wafer test, the signal PWB, the on-chip comparison test signal TOCC, the parallel test signal TPARADT, and the multibit output parallel test signal TPARAP are set to low, low, high, and low, respectively. This allows the RDFIFO 81f to output the layer test result signals TDRD[0] to TDRD[7] to which the comparison results TRDATA[0] to TRDATA[7] are assigned, respectively, to the wafer test output buffer 68. In this case, the data amount of the layer test result signal is 8 bits. When performing a 1-bit output wafer test, the signal PWB, the on-chip comparison test signal TOCC, the parallel test signal TPARADT, and the multibit output parallel test signal TPARAP are set to low, high, high, and high, respectively. This allows the RDFIFO 81f to output the layer test result signals TDRD[0] to TDRD[7] that are the same data to the wafer test output buffer 68. In this case, the data amount of the layer test result signal is 1 bit. When performing a post assembly test, the signal PWB, the on-chip comparison test signal TOCC, the parallel test signal TPARADT, and the multibit output parallel test signal TPARAP are all set to high. This allows the AND circuit 81g to output the 1-bit layer test result signal TRDATAL<n> to the through silicon via TSVPT0<n>. In this case, the data amount of the layer test result signal is 1 bit.

TABLE 1

| Test type | PWB | TOCC | TPARADT | TPARAP | Output destination | Output data amount |
|---|---|---|---|---|---|---|
| Wafer test Multibit output test | L (ACT) | L (NAT) | H (ACT) | L (ACT) | Wafer test input/output buffer | 8 |
| Wafer test 1-bit output test | L (ACT) | H (ACT) | H (ACT) | H (NAT) |  | 1 |
| Post-assembly test | H (NAT) | H (ACT) | H (ACT) | H (NAT) | TSVPT0 | 1 |

Figure 16:
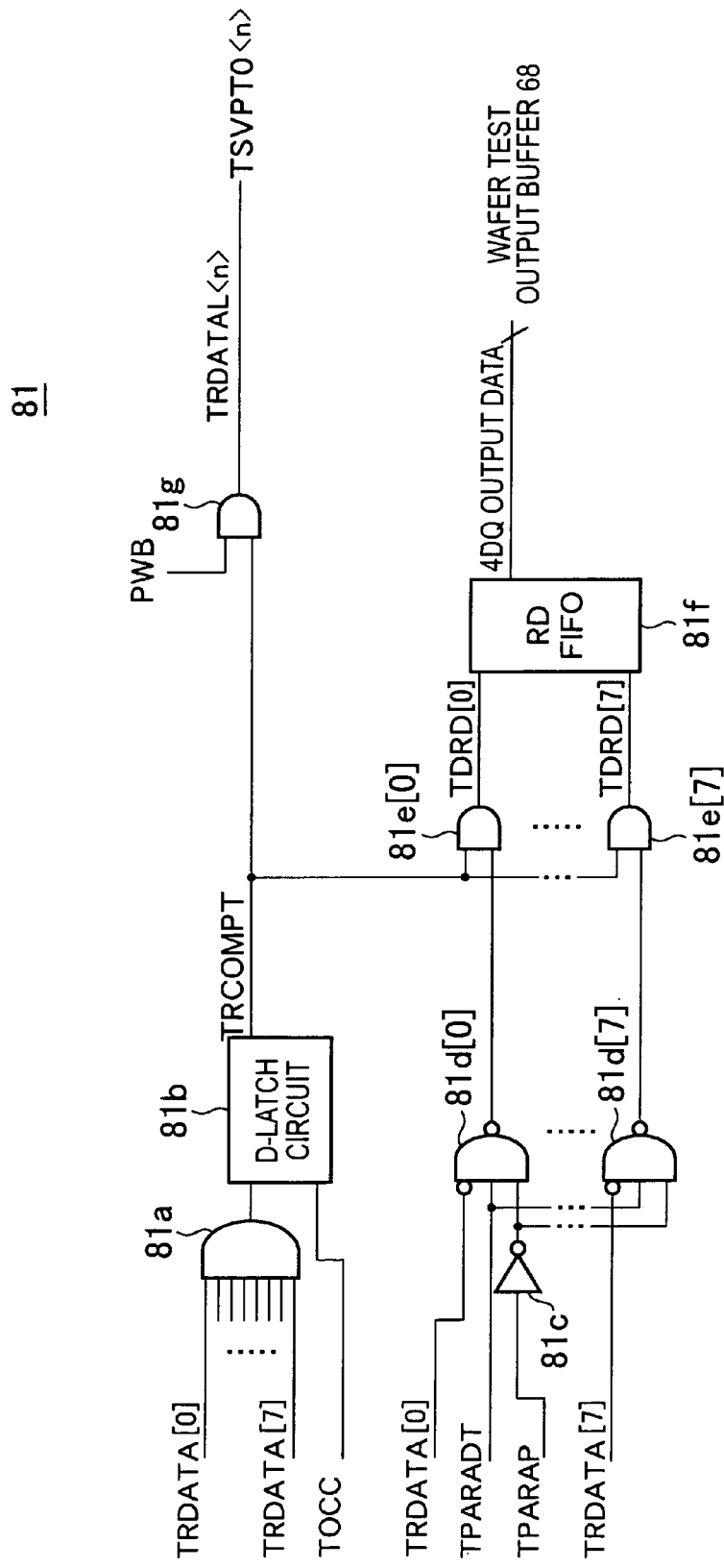
FIG. 16 is a schematic block diagram showing another example of the test output control units provided in the core chips.

FIG. 16 is a schematic block diagram showing another example of the test output control unit 81. The example shown in FIG. 16 is different from the example shown in FIG. 15 in that the output TRCOMPT of the D-Latch circuit 81b and the signal PWB are supplied to the AND circuit 81g, but the relation between the signal PWB, the on-chip comparison test signal TOCC, the parallel test signal TPARADT, the multibit output parallel test signal TPARAP, an output destination of the layer test result signal, and the number of output bits is the same as that in the example shown in FIG. 15. In this manner, the specific circuit configuration of the test output control unit 81 can be obtained by adopting various variations.

Figure 17:
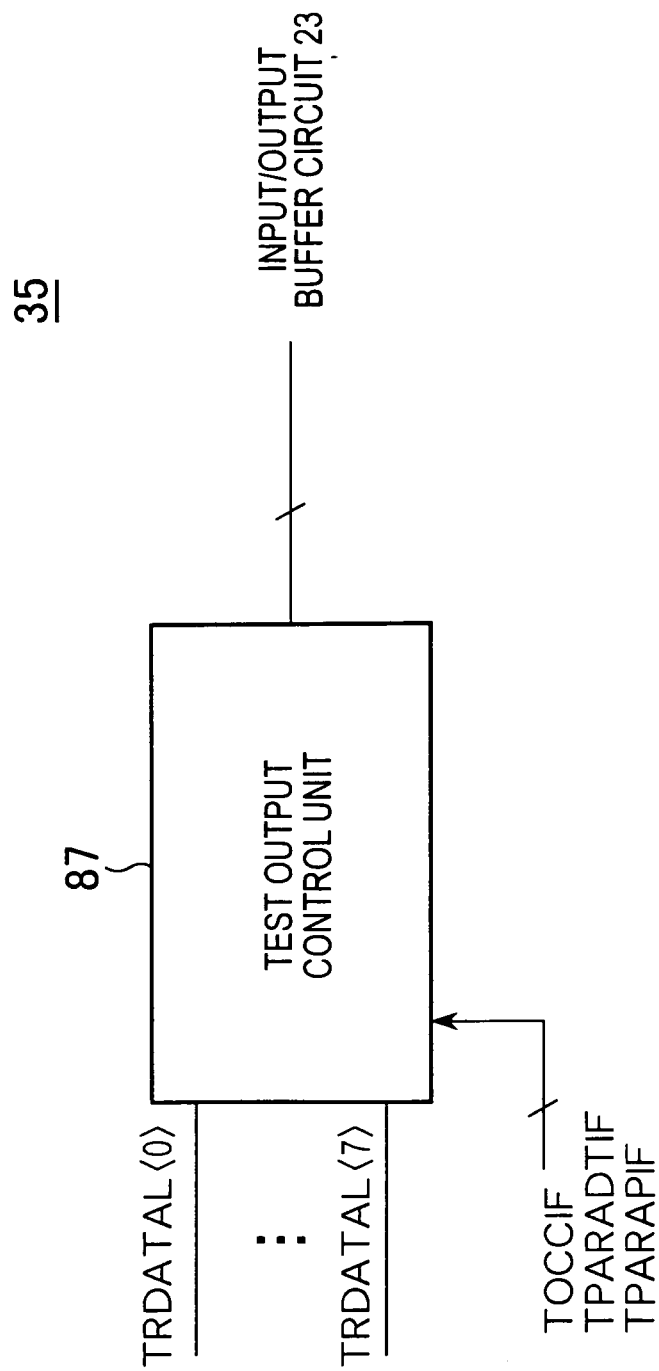
FIG. 17 is a schematic block diagram showing functional blocks of the test circuit provided in the interface chip.

FIG. 17 is a schematic block diagram showing functional blocks of the test circuit 35. As shown in FIG. 17, the test circuit 35 includes a test output control unit 87. The on-chip comparison test signal TOCCIF, the parallel test signal TPARADTIF, and the multibit output parallel test signal TPARAPIF are supplied to the test output control unit 87, as well as the 1-bit layer test result signals TRDATAL<0> to TRDATAL<7> output from the core chips CC0 to CC7. The on-chip comparison test signal TOCCIF, the parallel test signal TPARADTIF, and the multibit output parallel test signal TPARAPIF are the same signals as the on-chip comparison test signal TOCC, the parallel test signal TPARADT, and the multibit output parallel test signal TPARAP described above, respectively.

If the on-chip comparison test signal TOCCIF is in the NAT state (the multibit output test) and if the multibit output parallel test signal TPARAPIF is in the ACT state (the multibit output test), the test output control unit 87 assigns the layer test result signals TRDATAL<0> to TRDATAL<7> to layer test result signals TDRDL<0> to TDRDL<7>, respectively. On the other hand, if the on-chip comparison test signal TOCCIF is in the ACT state (the 1-bit output test) and if the multibit output parallel test signal TPARAPIF is in the NAT state (the 1-bit output test), the test output control unit 87 generates a 1-bit layer test result signal based on the layer test result signals TRDATAL<0> to TRDATAL<7>, and assigns this layer test result signal to all the layer test result signals TDRDL<0> to TDRDL<7>.

Figure 18:
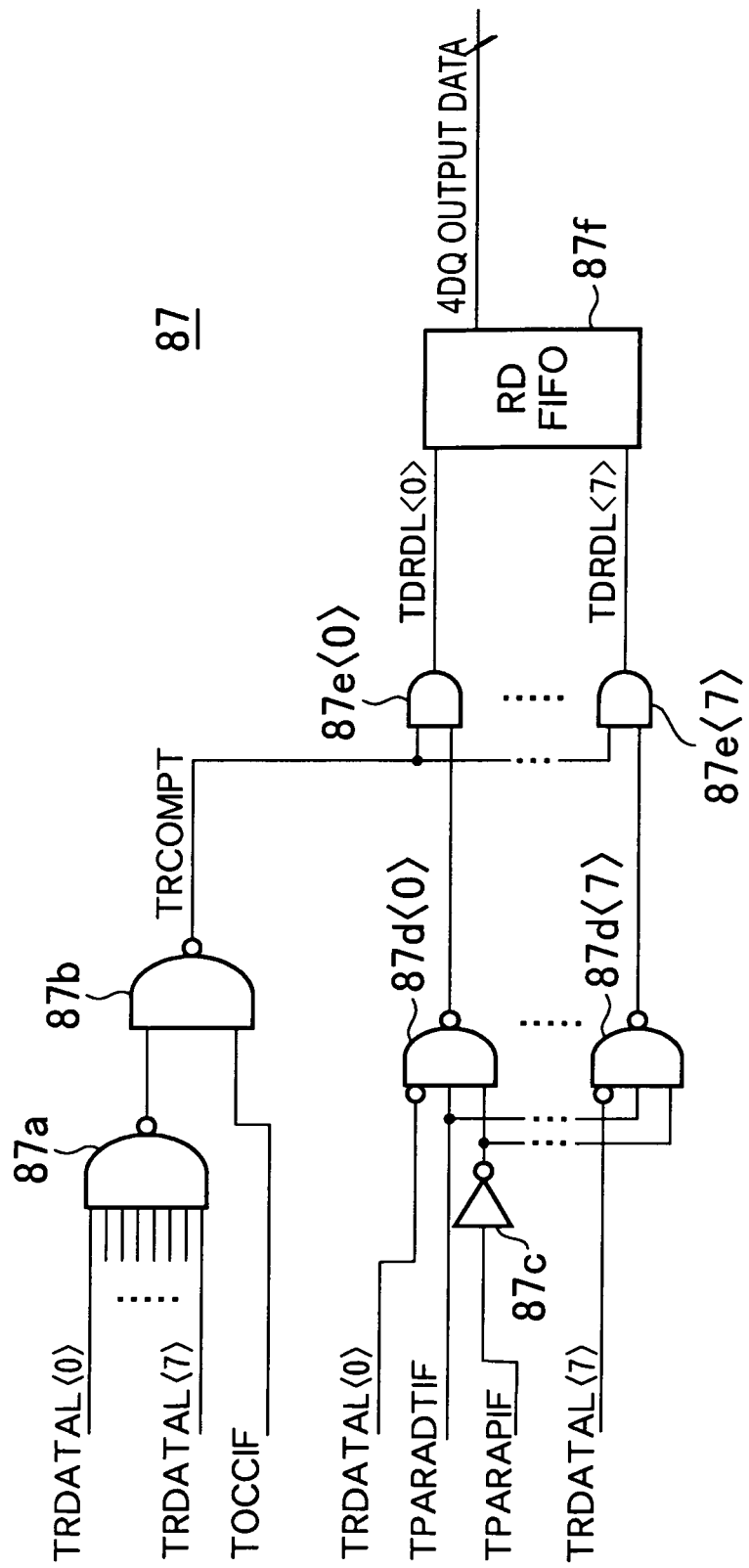
FIG. 18 is a schematic block diagram showing an example of the test output control unit provided in the interface chip.

FIG. 18 is a schematic block diagram showing an example of the test output control unit 87. In this example, the on-chip comparison test signal TOCCIF and the parallel test signal TPARADTIF are high-active signals and the multibit output parallel test signal TPARAPIF is a low-active signal.

As shown in FIG. 18, the test output control unit 87 includes a NAND circuit 87a to which the layer test result signals TRDATAL<0> to TRDATAL<7> are supplied, a NAND circuit 87b to which an output of the NAND circuit 87a and the on-chip comparison test signal TOCCIF are input, a NOT circuit 87c to which the multibit output parallel test signal TPARAPIF is supplied, NAND circuits 87d<0> to 87d<7> to which an output of the NOT circuit 87c, the parallel test signal TPARADTIF, and inverted data of the layer test result signals TRDATAL<0> to TRDATAL<7> are respectively supplied, AND circuits 87e<0> to 87e<7> to which an output TRCOMPT (1 DQ) of the NAND circuit 87b and outputs of the NAND circuits 87d<0> to 87d<7> are respectively supplied, and an RDFIFO 87f to which each of output signals TDRDL<0> to TDRDL<7> of the AND circuits 87e<0> to 87e<7> is supplied. Among these circuits, the RDFIFO 87f is a circuit that is synchronized with rising and falling of the internal clock signal ICLK, converts the output signals TDRDL<0> to TDRDL<7> into 4 DQ data, and outputs the converted data.

Table 2 shows a relation between the on-chip comparison test signal TOCCIF, the parallel test signal TPARADTIF, the multibit output parallel test signal TPARAPIF, and the number of output bits of the layer test result signal. When performing a multibit output post-assembly test, the on-chip comparison test signal TOCCIF, the parallel test signal TPARADTIF, and the multibit output parallel test signal TPARAPIF are set to low, high, and low, respectively. This allows the RDFIFO 87f to output the layer test result signals TDRDL<0> to TDRDL<7> to which the layer test result signals TRDATAL<0> to TRDATAL<7> are assigned, respectively, to the input/output buffer circuit 23. In this case, the data amount of the layer test result signal is 8 bits. When performing a 1-bit output post-assembly test, the on-chip comparison test signal TOCCIF, the parallel test signal TPARADTIF, and the multibit output parallel test signal TPARAPIF are all set to high. This allows the RDFIFO 87f to output the layer test result signals TDRDL<0> to TDRDL<7> that are the same data to the input/output buffer circuit 23. In this case, the data amount of the layer test result signal is 1 bit.

TABLE 2

| Test type | TOCCIF | TPARADTIF | TPARAPIF | Output data amount |
|---|---|---|---|---|
| Post-assembly test Multibit output test | L (NAT) | H (ACT) | L (ACT) | 8 |
| Post-assembly test 1-bit output test | H (ACT) | H (ACT) | H (NAT) | 1 |

Figure 19:
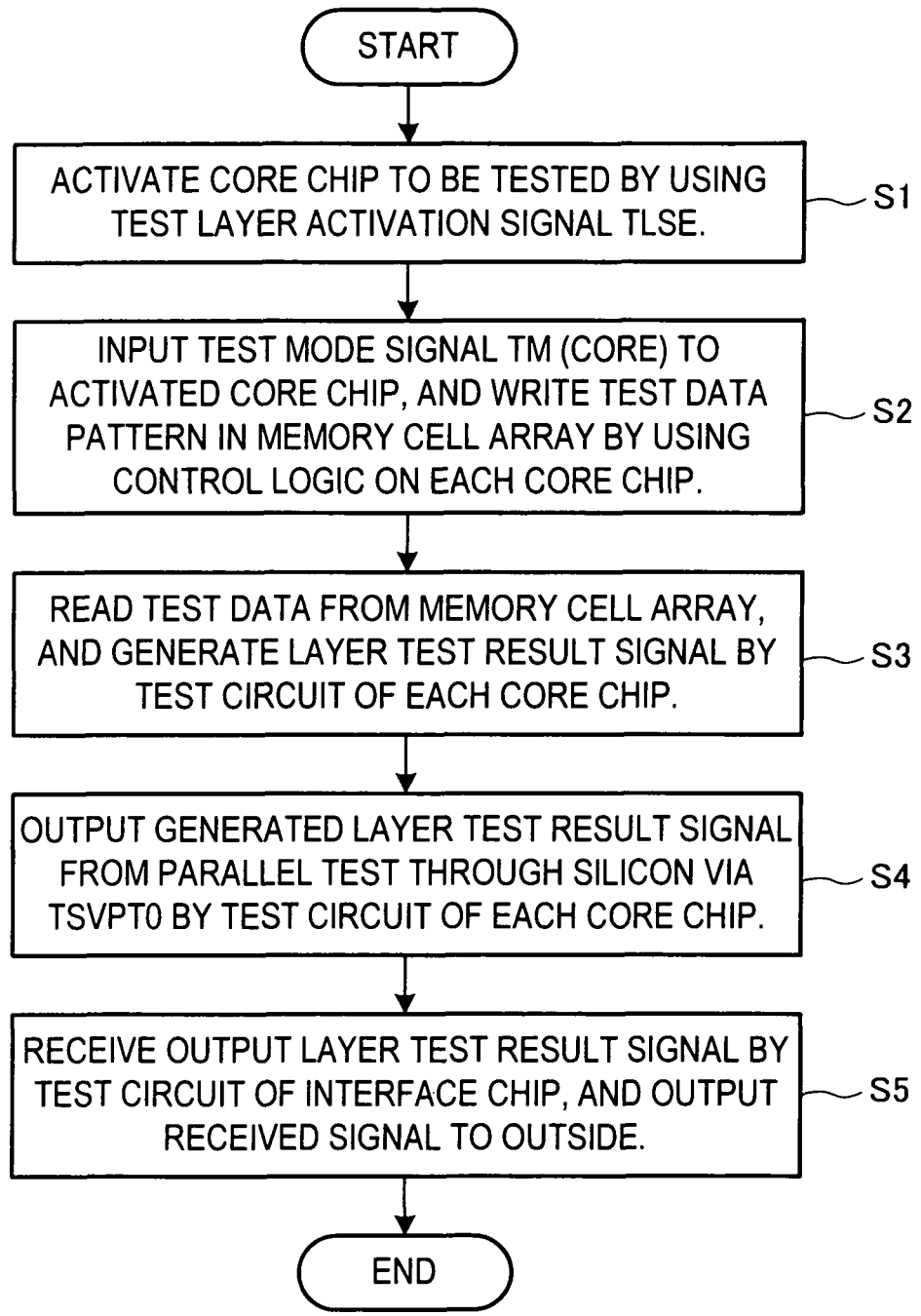
FIG. 19 is a flowchart showing a process flow of the post-assembly test.

FIG. 19 is a flowchart showing a process flow of the post-assembly test. First, a test layer activation signal TLA that designates a core chip to be subject to a parallel test is supplied to the test mode register by inputting predetermined address signal and command signal from outside (Step S1). This allows the core chip to be subject to the test to be activated, and the other core chips to be non-activated.

Subsequently, a test mode signal TM (Core) is supplied to the activated core chip by inputting a predetermined address signal from outside. Furthermore a test data pattern is written in a memory cell array provided in the core chip to be subject to the test by using the control logic circuit 63 on each core chip (Step S2).

Thereafter, test data is read from the memory cell array in the test circuit 67 of each core chip, and a layer test result signal TRDATAL<n> is generated (Step S3). Furthermore, the generated layer test result signal TRDATAL<n> is output from the through silicon via TSVPT0<n> of each core chip (Step S4). Because the through silicon via TSVPT0<n> is spirally connected, there will be no collision between the layer test result signals TRDATAL<n> output from the core chips at this step.

Finally, the test circuit 35 of the interface chip IF receives the layer test result signals TRDATAL<n> output from the core chips, and outputs the layer test result signals TRDATAL<n> to outside via the input/output buffer circuit 23 (Step S5).

As explained above, in the semiconductor device 10 according to the present embodiment, because the layer test result signals are output from different current paths that vary from one core chip to another when performing a post-assembly test, it is possible to output the layer test result signals of a plurality of core chips all together. Therefore, the time required for the post-assembly test of the semiconductor device is shortened, as compared to a case of sequentially outputting layer test result signals of a plurality of core chips.

Figure 20:
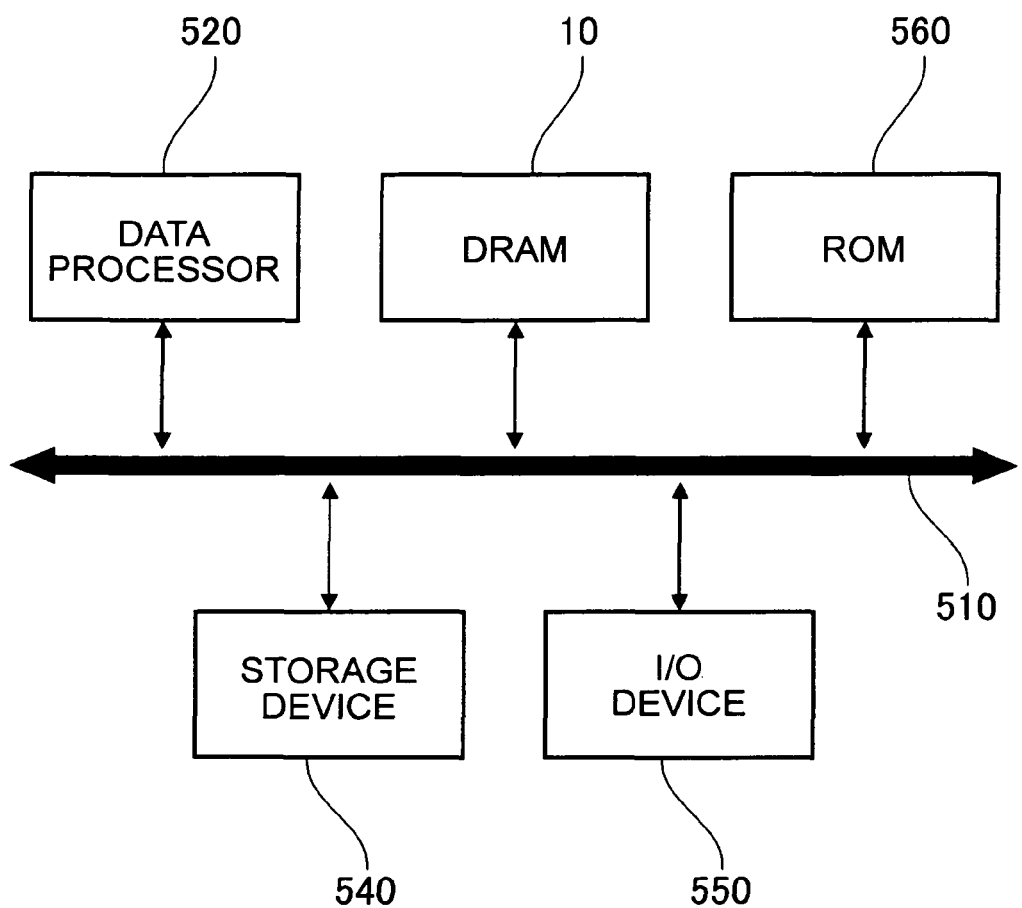
FIG. 20 is a block diagram showing the configuration of a data processing system using the semiconductor memory device according to the preferred embodiment.

FIG. 20 is a block diagram showing the configuration of a data processing system 500 using the semiconductor memory device 10 according to this embodiment.

The data processing system 500 shown in FIG. 13 has a configuration in which a data processor 520 and the semiconductor device (DRAM) 10 according to this embodiment is mutually connected via a system bus 510. The data processor 520, for example, includes micro-processor (MPU) or digital signal processor (DSP). But it is not limited to them. In FIG. 20, for the sake of shorthand, the data processor 520 and the DRAM 10 are connected via the system bus 510. But they may be connected using a local bus not via the system bus 510.

In FIG. 20, for the sake of shorthand, only one set of the system bus 510 is drawn. But a plurality of system buses 510 may be provided in serial or parallel manner via some connectors etc., if needed. In the data processing system 500 shown in FIG. 20, a storage device 540, I/O device 550, and ROM 560 are also connected to the system bus 510. But these components are not in dispensable.

The storage device 540 may be a hard disk drive, an optical disk drive, or a flash memory. The I/O device 550 may be one or more display devices such as a liquid display, but not limited to, or one or more input devices such as a keyboard, a mouse, but not limited to.

I/O device 550 can be only one of the input device and the output device.

Though only one component is drawn for each of the components shown in FIG. 13, the number of each of the components is not limited to one. The data processing system 500 can include a plurality of each of the components.

It is apparent that the present invention is not limited to the above embodiments, but may be modified and changed without departing from the scope and spirit of the invention.

For example, in the above described embodiment, the DDR3-type SDRAM is used as the core chip, but the present invention is not limited thereto. Accordingly, the core chip may be a DRAM other than the DDR3-type and may be a semiconductor memory (SRAM, PRAM, MRAM, flash memory, etc.) other than the DRAM. The number of core chips is not restricted to 8.

Further, although, with the above embodiment, the interface chip IF serially supplies the enable signal TLSE and disable signal TLSD, the disable signal TLSD does not need to be used with the present invention, and at least the enable signal TLSE only needs to be serially supplied.

What is claimed is:

1. A semiconductor device comprising:
a plurality of core chips each of which comprises a memory cell array including a plurality of memory cells; and
an interface chip that controls the core chips, wherein
the interface chip and the core chips are stacked,
the core chips are electrically connected in common to the interface chip through a first current path,
the interface chip serially supplies an enable signal comprised of a plurality of bits to the core chips through the first current path, each of the bits of the enable signal being assigned to an associated one of the core chips, and
each of the core chips is activated based on a logic level of an associated one of the bits of the enable signal.

2. The semiconductor device as claimed in claim 1, wherein
the core chips are electrically connected in common to the interface chip through a second current path,
the interface chip supplies a timing signal synchronized with the enable signal to the core chips through the second current path, and
the core chips take in the enable signal in synchronization with the timing signal.

3. The semiconductor device as claimed in claim 1, wherein
the core chips are electrically connected in common to the interface chip through a third current path,
the interface chip serially supplies a disable signal comprised of a plurality of bits to the core chips through the third current path, each of the bits of the disable signal being assigned to an associated one of the core chips, and
each of core chips is deactivated based on a logic level of an associated one of the bit of the disable signal.

4. The semiconductor device as claimed in claim 3, wherein each of core chips is deactivated based on the logic level of the associated one of the bit of the disable signal irrespectively of the enable signal.

5. The semiconductor device as claimed in claim 1, wherein
each of the core chips is electrically connected to the interface chip through an associated one of fourth current paths,
each of the core chips generates a layer test result signal by compressing test data read from the memory cell array when activated based on the enable signal, and
each of the core chips further comprise a first test circuit which supplies the layer test result signal to the interface chip through the associated one of the fourth current paths.

6. The semiconductor device as claimed in claim 5, wherein the interface chip comprises a second test circuit that outputs the layer test result signals supplied from the core chips to outside.

7. The semiconductor device as claimed in claim 6, wherein
each of the core chips includes at least a same number of through silicon vias as a number of the core chips,
each of the through silicon vias is electrically connected to one of the through silicon vias included in adjacent one of the core chips arranged in a different plane position viewed from a stacking direction, and
each of the fourth current paths is configured by the through silicon vias electrically connected.

8. The semiconductor device as claimed in claim 7, wherein each of the first test circuits outputs the layer test result signal to one of the through silicon vias arranged in a same plane position viewed from the stacking direction.

9. A semiconductor device comprising:
a plurality of core chips each of which comprises a memory cell array including a plurality of memory cells, and to which chip identification information different from each other are allocated; and
an interface chip which controls the core chips, wherein
the interface chip and the core chips are stacked,
the core chips are electrically connected in common to the interface chip through a first current path,
each of the core chips is electrically connected to the interface chip through an associated one of fourth current paths,
the interface chip supplies an enable signal to the core chips through the first current path,
the core chips are selectively activated by comparing the enable signal and the chip identification information, and
each of the core chips is activated according to the enable signal, activated one of the core chips generating a layer test result signal by compressing test data read from the memory cell array and supplies the layer test result signal to the interface chip through the associated one of the fourth current paths.

10. The semiconductor device as claimed in claim 9, wherein
the core chips are electrically connected in common to the interface chip through a second current path,
the interface chip supplies a timing signal synchronized with the enable signal to the core chips through the second current path, and
the core chips take in the enable signal in synchronization with the timing signal.

11. The semiconductor device as claimed in claim 9, wherein
- the core chips are electrically connected in common to the interface chip through a third current path,
- the interface chip supplies a disable signal to the core chips through the third current path, and
- each of the core chips is deactivated according to the disable signal, disable one of the core chips does not read the test data from the memory cell array.

12. A method of testing a semiconductor device comprising:
- providing the semiconductor device including a plurality of core chips each of which comprises a memory cell array including a plurality of memory cells and an interface chip that controls the core chips, the interface chip and the plurality of core chips being stacked;
- serially supplying an enable signal comprised of a plurality of bits from the interface chip to the core chips through a first current path electrically connected in common to the core chips, each of the bits of the enable signal being assigned to an associated one of the core chips;
- activating one or more of core chips based on a logic level of each bit of the enable signal;
- generating a layer test result signal by compressing test data read from the memory cell array in activated one or more of the core chips; and
- supplying the layer test result signal from activated one or more of the core chips to the interface chip through an associated one of fourth current paths.

* * * * *